(12) United States Patent
Di Vincenzo

(10) Patent No.: US 11,749,360 B2
(45) Date of Patent: *Sep. 5, 2023

(54) TECHNIQUES FOR PROGRAMMING SELF-SELECTING MEMORY

(71) Applicant: Micron Technology, Inc., Boise, ID (US)

(72) Inventor: Umberto Di Vincenzo, Capriate san Gervasio (IT)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/573,229

(22) Filed: Jan. 11, 2022

(65) Prior Publication Data

US 2022/0208291 A1 Jun. 30, 2022

Related U.S. Application Data

(63) Continuation of application No. 17/006,197, filed on Aug. 28, 2020, now Pat. No. 11,238,945.

(51) Int. Cl.
*G11C 7/00* (2006.01)
*G11C 16/34* (2006.01)
(Continued)

(52) U.S. Cl.
CPC .......... *G11C 16/3459* (2013.01); *G11C 16/10* (2013.01); *G11C 16/26* (2013.01); *G11C 16/30* (2013.01); *G11C 16/3404* (2013.01)

(58) Field of Classification Search
CPC ....... G11C 7/1078; G11C 7/22; G11C 7/1006; G11C 7/1072; G11C 7/1096
(Continued)

(56) References Cited

U.S. PATENT DOCUMENTS

| 8,174,878 | B2 | 5/2012 | Park et al. |
| 9,042,160 | B1 * | 5/2015 | Gorobets ........... G11C 13/0002 365/189.05 |

(Continued)

FOREIGN PATENT DOCUMENTS

| CN | 108806746 A | 11/2018 |
| CN | 111465987 A | 7/2020 |
| CN | 111465988 A | 7/2020 |

OTHER PUBLICATIONS

Chinese Patent Office, "Search report," issued in connection with Chinese Patent Application No. 202110987232.0 dated Jul. 18, 2022 (1 pages).

*Primary Examiner* — Son T Dinh
(74) *Attorney, Agent, or Firm* — Holland & Hart LLP

(57) ABSTRACT

Methods, systems, and devices that support techniques for programming self-selecting memory are described. Received data may include a first group of bits that each have a first logic value and a second group of bits that each have a second logic value. The first and second group of bits may be stored in a first set of memory cells and a second set of memory cells, respectively. A first programming operation for writing the second logic value to both the first and second set of memory cells and verifying whether the second logic value is written to each of the first set of memory cells, the second set of memory cells, or both may be performed. A second programming operation may write the first logic value to either the first set of memory cells or the second set of memory cells based on a result of the verification.

20 Claims, 11 Drawing Sheets

(51) Int. Cl.
  *G11C 16/30* (2006.01)
  *G11C 16/26* (2006.01)
  *G11C 16/10* (2006.01)

(58) Field of Classification Search
  USPC ........................................ 365/189.14, 189.16
  See application file for complete search history.

(56) References Cited

U.S. PATENT DOCUMENTS

| | | |
|---|---|---|
| 9,570,175 B2 | 2/2017 | Liu |
| 11,238,945 B1* | 2/2022 | Di Vincenzo .......... G11C 16/10 |
| 2015/0227729 A1 | 8/2015 | Grigg et al. |
| 2020/0327940 A1 | 10/2020 | Tortorelli et al. |
| 2020/0381046 A1 | 12/2020 | Redaelli et al. |

* cited by examiner

US 11,749,360 B2

TECHNIQUES FOR PROGRAMMING SELF-SELECTING MEMORY

CROSS REFERENCE

The present Application for patent is a continuation of U.S. patent application Ser. No. 17/006,197 by Di Vincenzo, entitled "TECHNIQUES FOR PROGRAMMING SELF-SELECTING MEMORY" filed Aug. 28, 2020, assigned to the assignee hereof, and is expressly incorporated by reference in its entirety herein.

BACKGROUND

The following relates generally to one or more systems for memory and more specifically to techniques for programming self-selecting memory.

Memory devices are widely used to store information in various electronic devices such as computers, wireless communication devices, cameras, digital displays, and the like. Information is stored by programming memory cells within a memory device to various states. For example, binary memory cells may be programmed to one of two supported states, often denoted by a logic 1 or a logic 0. In some examples, a single memory cell may support more than two states, any one of which may be stored. To access the stored information, a component may read, or sense, at least one stored state in the memory device. To store information, a component may write, or program, the state in the memory device.

Various types of memory devices and memory cells exist, including magnetic hard disks, random access memory (RAM), read-only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), self-selecting memory, chalcogenide memory technologies, and others. Memory cells may be volatile or non-volatile.

DETAILED DESCRIPTION

Figure 1:
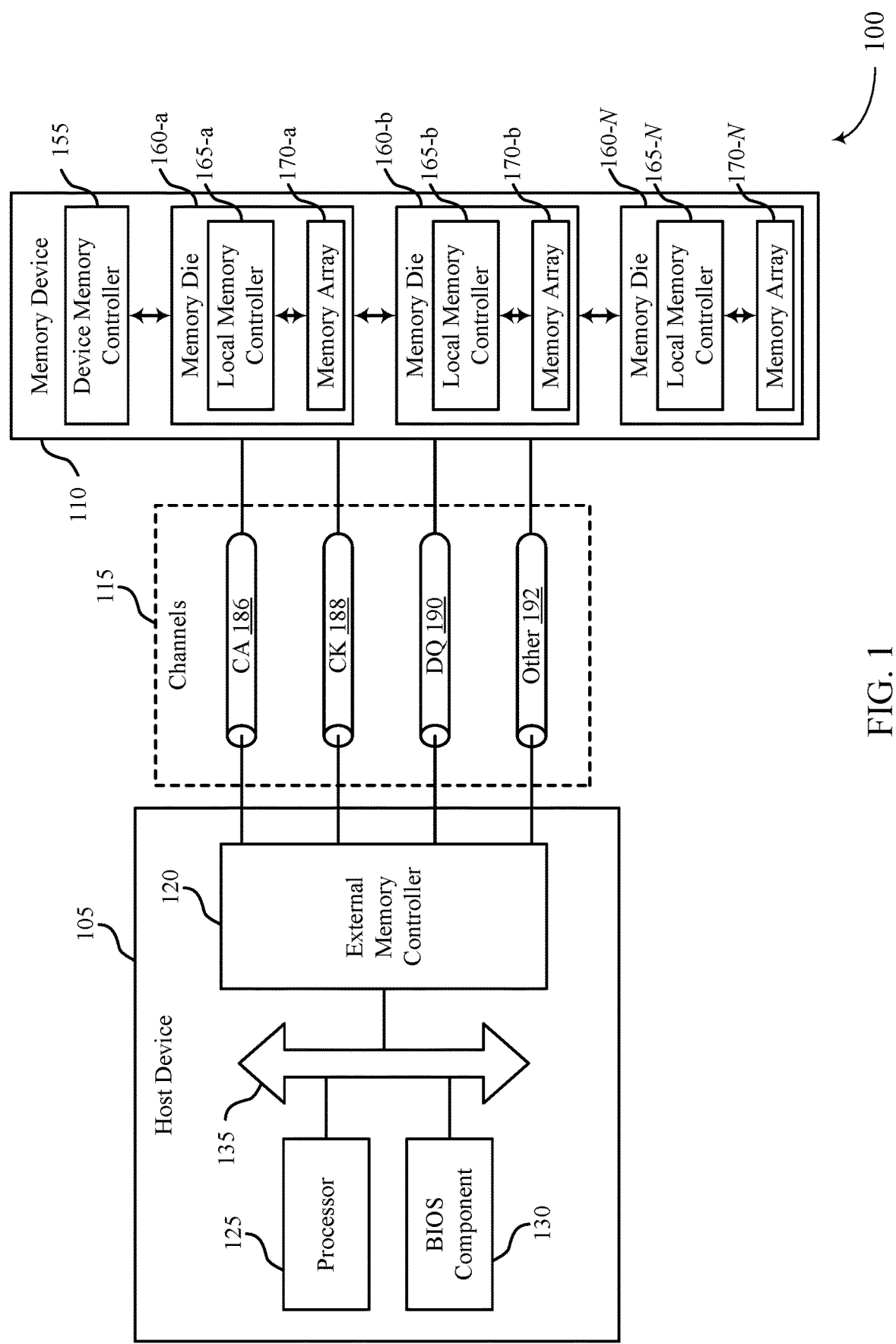
FIG. 1 illustrates an example of a system that supports techniques for programming self-selecting memory in accordance with examples as disclosed herein.

A memory device may store data in a set of memory cells. The set of memory cells may include one or more memory cells that respond to a programming voltage in an unexpected manner (also referred to as "defective memory cells"). In some examples, a defective memory cell may exhibit a low threshold voltage after a programming pulse used to program a high threshold voltage is applied to the memory cell, and vice versa. A defective memory cell having a threshold voltage that exceeds a programming voltage (also referred to as a "high-$V_{th}$ memory cell") may be unaffected by subsequent programming operations—thus, a particular logic value (e.g., a logic value 0) may be stored at the memory cell indefinitely. Similarly, a different logic value (e.g., a logic value 1) may be indefinitely stored at a defective memory cell having a maximum threshold voltage that is below a threshold value (also referred to as a "low-$V_{th}$ memory cell"). Thus, when storing data in a set of memory cells that includes one or more defective memory cells, the stored data may automatically include one or more errors if the programming operation attempts to write a logic value to a defective memory cell that is different than the logic state that is indefinitely stored by the memory cell.

One technique used to reduce errors associated with high-$V_{th}$ memory cells may be to use larger programming voltages. Also, a technique used to manage errors associated with defective memory cells may be to use error correction circuitry that detects and/or corrects a limited number of errors in data read from a set of memory cells. But using larger programming voltages to accommodate high-$V_{th}$ memory cells may increase an energy consumption of a memory device and/or reduce an operating life of the memory cells. Also, using error correction circuitry to detect/correct errors caused by defective memory cells may reduce the quantity of errors caused by other programming failures that the error correction circuitry is able to detect/correct.

To preserve the error correcting abilities of the error correction circuitry (e.g., the error correction code), enhanced data storage techniques that store noninverted (e.g., original) or inverted data based on defective memory cell detection may be used. For example, data may be received for storage in a set of memory cells in a memory array. The data may include a first set of bits that have a first logic value (e.g., a '1') and a second set of bits that have a second logic value (e.g., a '0'). Similarly, the first set of bits (and the first logic value) may correspond to a first subset of the memory cells and the second set of bits (and the second logic value) may correspond to a second, non-overlapping subset of the memory cells. After receiving the data, a first programming operation that writes the second logic value to each of the memory cells of the first subset and the second subset. After, or as part of the first programming operation, an operation for verifying whether the second logic value was written to each of the second subset of memory cells may be performed.

If any of the second subset of memory cells are identified as not storing the second logic value, a second programming operation that writes the first logic value to the second subset of memory cells may be performed, causing an inverted version of the data to be stored at the set of memory cells—e.g., with no or a reduced quantity of errors. In some examples, the second programming operation may also be used to program a storage management bit (also referred to as a "flip bit") to indicate that the set of memory cells is storing inverted data after the second programming operation. Otherwise, if all of the second subset of memory cells are identified as storing the second logic value, a second programming operation that writes the first logic value to the first subset of memory cells may be performed, causing the non-inverted version of the data (also referred to as the original data) to be stored at the set of memory cells. By performing the enhanced data storage procedure, an error that would otherwise be caused by a high-$V_{th}$ or low-$V_{th}$ memory cell may be avoided. For example, these techniques would correct an error caused by a memory cell that is stuck at a single logic state (e.g., '1') without using error control code techniques.

The enhanced data storage procedure may also be used to reduce power consumption. For example, a voltage of the programming voltage used by the data storage procedure may be reduced such that the programming voltage is not selected to accommodate memory cells with abnormally high (yet programmable) threshold voltages. In some examples, the programming voltage is selected to accommodate threshold voltages that fall within a six sigma range, rather than threshold voltages that fall within a seven sigma range of a Gaussian distribution. In such examples, an abnormally high-$V_{th}$ memory cell that is included in the second subset of memory cells may not be programmed to store the second logic value after the first programming operation is performed. Thus, an inverted version of the data may be stored at the set of memory cells during a second programming operation, and the abnormally high-$V_{th}$ memory cell may store the first logic value after the second programming operation without introducing an error into the stored inverted version of the data.

Features of the disclosure are initially described in the context of systems and dies. Features of the disclosure are further described in the flowcharts and process diagrams. These and other features of the disclosure are further illustrated by and described with reference to an apparatus diagram and a flowchart that relate to techniques for programming self-selecting memory.

FIG. 1 illustrates an example of a system 100 that supports techniques for programming self-selecting memory in accordance with examples as disclosed herein. The system 100 may include a host device 105, a memory device 110, and a plurality of channels 115 coupling the host device 105 with the memory device 110. The system 100 may include one or more memory devices, but aspects of the one or more memory devices 110 may be described in the context of a single memory device (e.g., memory device 110).

The system 100 may include portions of an electronic device, such as a computing device, a mobile computing device, a wireless device, a graphics processing device, a vehicle, or other systems. For example, the system 100 may illustrate aspects of a computer, a laptop computer, a tablet computer, a smartphone, a cellular phone, a wearable device, an internet-connected device, a vehicle controller, or the like. The memory device 110 may be a component of the system operable to store data for one or more other components of the system 100.

At least portions of the system 100 may be examples of the host device 105. The host device 105 may be an example of a processor or other circuitry within a device that uses memory to execute processes, such as within a computing device, a mobile computing device, a wireless device, a graphics processing device, a computer, a laptop computer, a tablet computer, a smartphone, a cellular phone, a wearable device, an internet-connected device, a vehicle controller, a system on a chip (SoC), or some other stationary or portable electronic device, among other examples. In some examples, the host device 105 may refer to the hardware, firmware, software, or a combination thereof that implements the functions of an external memory controller 120. In some examples, the external memory controller 120 may be referred to as a host or a host device 105.

A memory device 110 may be an independent device or a component that is operable to provide physical memory addresses/space that may be used or referenced by the system 100. In some examples, a memory device 110 may be configurable to work with one or more different types of host devices 105. Signaling between the host device 105 and the memory device 110 may be operable to support one or more of: modulation schemes to modulate the signals, various pin configurations for communicating the signals, various form factors for physical packaging of the host device 105 and the memory device 110, clock signaling and synchronization between the host device 105 and the memory device 110, timing conventions, or other factors.

The memory device 110 may be operable to store data for the components of the host device 105. In some examples, the memory device 110 may act as a slave-type device to the host device 105 (e.g., responding to and executing commands provided by the host device 105 through the external memory controller 120). Such commands may include one or more of a write command for a write operation, a read command for a read operation, a refresh command for a refresh operation, or other commands.

The host device 105 may include one or more of an external memory controller 120, a processor 125, a basic input/output system (BIOS) component 130, or other components such as one or more peripheral components or one or more input/output controllers. The components of host device 105 may be coupled with one another using a bus 135.

The processor 125 may be operable to provide control or other functionality for at least portions of the system 100 or at least portions of the host device 105. The processor 125 may be a general-purpose processor, a digital signal processor (DSP), an application-specific integrated circuit (ASIC), a field-programmable gate array (FPGA) or other programmable logic device, discrete gate or transistor logic, discrete hardware components, or a combination of these components. In such examples, the processor 125 may be an example of a central processing unit (CPU), a graphics processing unit (GPU), a general purpose GPU (GPGPU), or an SoC, among other examples. In some examples, the external memory controller 120 may be implemented by or be a part of the processor 125.

The BIOS component 130 may be a software component that includes a BIOS operated as firmware, which may initialize and run various hardware components of the system 100 or the host device 105. The BIOS component 130 may also manage data flow between the processor 125 and the various components of the system 100 or the host device 105. The BIOS component 130 may include a program or software stored in one or more of read-only memory (ROM), flash memory, or other non-volatile memory.

The memory device 110 may include a device memory controller 155 and one or more memory dies 160 (e.g., memory chips) to support a desired capacity or a specified capacity for data storage. Each memory die 160 may include a local memory controller 165 (e.g., local memory controller 165-*a*, local memory controller 165-*b*, local memory controller 165-N) and a memory array 170 (e.g., memory array 170-*a*, memory array 170-*b*, memory array 170-N). A memory array 170 may be a collection (e.g., one or more grids, one or more banks, one or more tiles, one or more sections) of memory cells, with each memory cell being operable to store at least one bit of data. A memory device 110 including two or more memory dies may be referred to as a multi-die memory or a multi-die package or a multi-chip memory or a multi-chip package.

The device memory controller 155 may include circuits, logic, or components operable to control operation of the memory device 110. The device memory controller 155 may include the hardware, the firmware, or the instructions that enable the memory device 110 to perform various operations and may be operable to receive, transmit, or execute commands, data, or control information related to the components of the memory device 110. The device memory controller 155 may be operable to communicate with one or more of the external memory controller 120, the one or more memory dies 160, or the processor 125. In some examples, the device memory controller 155 may control operation of the memory device 110 described herein in conjunction with the local memory controller 165 of the memory die 160.

A local memory controller 165 (e.g., local to a memory die 160) may include circuits, logic, or components operable to control operation of the memory die 160. In some examples, a local memory controller 165 may be operable to communicate (e.g., receive or transmit data or commands or both) with the device memory controller 155. In some examples, a memory device 110 may not include a device memory controller 155, and a local memory controller 165, or the external memory controller 120 may perform various functions described herein. As such, a local memory controller 165 may be operable to communicate with the device memory controller 155, with other local memory controllers 165, or directly with the external memory controller 120, or the processor 125, or a combination thereof. Examples of components that may be included in the device memory controller 155 or the local memory controllers 165 or both may include receivers for receiving signals (e.g., from the external memory controller 120), transmitters for transmitting signals (e.g., to the external memory controller 120), decoders for decoding or demodulating received signals, encoders for encoding or modulating signals to be transmitted, or various other circuits or controllers operable for supporting described operations of the device memory controller 155 or local memory controller 165 or both.

The external memory controller 120 may be operable to enable communication of one or more of information, data, or commands between components of the system 100 or the host device 105 (e.g., the processor 125) and the memory device 110. The external memory controller 120 may convert or translate communications exchanged between the components of the host device 105 and the memory device 110. In some examples, the external memory controller 120 or other component of the system 100 or the host device 105, or its functions described herein, may be implemented by the processor 125. For example, the external memory controller 120 may be hardware, firmware, or software, or some combination thereof implemented by the processor 125 or other component of the system 100 or the host device 105.

Although the external memory controller 120 is depicted as being external to the memory device 110, in some examples, the external memory controller 120, or its functions described herein, may be implemented by one or more components of a memory device 110 (e.g., a device memory controller 155, a local memory controller 165) or vice versa.

The components of the host device 105 may exchange information with the memory device 110 using one or more channels 115. The channels 115 may be operable to support communications between the external memory controller 120 and the memory device 110. Each channel 115 may be examples of transmission mediums that carry information between the host device 105 and the memory device. Each channel 115 may include one or more signal paths or transmission mediums (e.g., conductors) between terminals associated with the components of system 100. A signal path may be an example of a conductive path operable to carry a signal. For example, a channel 115 may include a first terminal including one or more pins or pads at the host device 105 and one or more pins or pads at the memory device 110. A pin may be an example of a conductive input or output point of a device of the system 100, and a pin may be operable to act as part of a channel.

Channels 115 (and associated signal paths and terminals) may be dedicated to communicating one or more types of information. For example, the channels 115 may include one or more command and address (CA) channels 186, one or more clock signal (CK) channels 188, one or more data (DQ) channels 190, one or more other channels 192, or a combination thereof. In some examples, signaling may be communicated over the channels 115 using single data rate (SDR) signaling or double data rate (DDR) signaling. In SDR signaling, one modulation symbol (e.g., signal level) of a signal may be registered for each clock cycle (e.g., on a rising or falling edge of a clock signal). In DDR signaling, two modulation symbols (e.g., signal levels) of a signal may be registered for each clock cycle (e.g., on both a rising edge and a falling edge of a clock signal).

To preserve the error correcting abilities of the error correction circuitry or algorithms, enhanced data storage techniques that store noninverted (e.g., original) or inverted data based on defective memory cell detection may be used. For example, data may be received at a memory device 110 for storage in a set of memory cells in a memory array (e.g., memory array 170-*a*). The data may include a first set of bits that have a first logic value and a second set of bits that have a second logic value. Similarly, the first set of bits may correspond to a first subset of the memory cells and the second set of bits may correspond to a second, non-overlapping subset of the memory cells. After receiving the data, the memory device 110 may perform a first programming operation that writes the second logic value to each of the memory cells and, in some examples, also verifies whether the second logic value was written to each of the second subset of memory cells.

If any of the second subset of memory cells are identified as not storing the second logic value, the memory device 110 may perform a second programming operation that writes the first logic value to the second subset of memory cells, causing an inverted version of the data to be stored at the set of memory cells—e.g., with no or reduced error. In some examples, the second programming operation may also be used to program a control bit (also referred to as a flip bit) to indicate that the set of memory cells is storing inverted data after the second programming operation. Otherwise, if all of the second subset of memory cells are identified as storing the second logic value, the memory device 110 may perform a second programming operation that writes the first logic value to the first subset of memory cells, causing the non-inverted version of the data (also referred to as the original data) to be stored at the set of memory cells. By performing the enhanced data storage procedure, an error that would otherwise be caused by a high-$V_{th}$ or low-$V_{th}$ memory cell may be avoided.

Figure 2:
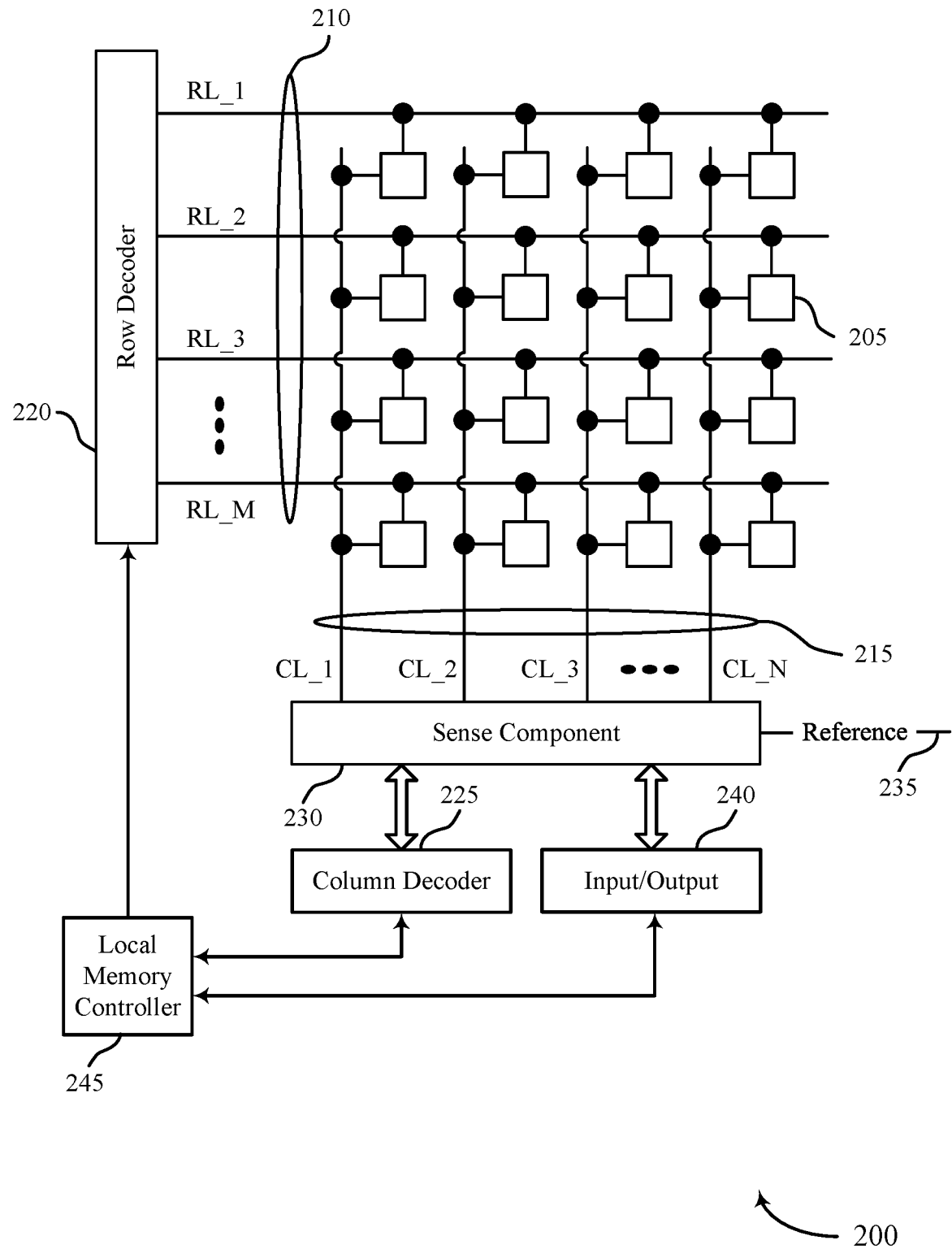
FIG. 2 illustrates an example of a memory die that supports techniques for programming self-selecting memory in accordance with examples as disclosed herein.

FIG. 2 illustrates an example of a memory die 200 that supports techniques for programming self-selecting memory in accordance with examples as disclosed herein. The memory die 200 may be an example of the memory dies 160 described with reference to FIG. 1. In some examples, the memory die 200 may be referred to as a memory chip, a memory device, or an electronic memory apparatus. The memory die 200 may include one or more memory cells 205 that may each be programmable to store different logic states (e.g., a programmed one of a set of two or more possible states). For example, a memory cell 205 may be operable to store one bit of information at a time (e.g., a logic 0 or a logic 1). In some examples, a memory cell 205 (e.g., a multi-level memory cell 205) may be operable to store more than one bit of information at a time (e.g., a logic 00, logic 01, logic 10, a logic 11). In some examples, the memory cells 205 may be arranged in an array, such as a memory array 170 described with reference to FIG. 1.

A memory cell 205 may store a logic state using a configurable material, which may be referred to as a memory element, a memory storage element, a material element, a material memory element, a material portion, or a polarity-written material portion, among others. A configurable material of a memory cell 205 may refer to a chalcogenide-based storage component, as described in more detail with reference to FIG. 3. For example, a chalcogenide storage element may be used in a phase change memory (PCM) cell, a thresholding memory cell, or a self-selecting memory cell.

The memory die 200 may include the access lines (e.g., row lines 210 and the column lines 215) arranged in a pattern, such as a grid-like pattern. Access lines may be formed of one or more conductive materials. In some examples, row lines 210 may be referred to as word lines. In some examples, column lines 215 may be referred to as digit lines or bit lines. References to access lines, row lines, column lines, word lines, digit lines, or bit lines, or their analogues, are interchangeable without loss of understanding or operation. Memory cells 205 may be positioned at intersections of the row lines 210 and the column lines 215.

Operations such as reading and writing may be performed on the memory cells 205 by activating or selecting access lines such as one or more of a row line 210 or a column line 215. By biasing a row line 210 and a column line 215 (e.g., applying a voltage to the row line 210 or the column line 215), a single memory cell 205 may be accessed at their intersection. The intersection of a row line 210 and a column line 215 in either a two-dimensional or three-dimensional configuration may be referred to as an address of a memory cell 205. An access line may be a conductive line coupled with a memory cell 205 and may be used to perform access operations on the memory cell 205.

Accessing the memory cells 205 may be controlled through a row decoder 220 or a column decoder 225. For example, a row decoder 220 may receive a row address from the local memory controller 260 and activate a row line 210 based on the received row address. A column decoder 225 may receive a column address from the local memory controller 260 and may activate a column line 215 based on the received column address.

The sense component 230 may be operable to detect a state (e.g., a material state, a resistance, a threshold state) of a memory cell 205 and determine a logic state of the memory cell 205 based on the stored state. The sense component 230 may include one or more sense amplifiers to amplify or otherwise convert a signal resulting from accessing the memory cell 205. The sense component 230 may compare a signal detected from the memory cell 205 to a reference signal 235 (e.g., a reference voltage). The detected logic state of the memory cell 205 may be provided as an output of the sense component 230 (e.g., to an input/output 240), and may indicate the detected logic state to another component of a memory device that includes the memory die 200.

The local memory controller 260 may control the accessing of memory cells 205 through the various components (e.g., row decoder 220, column decoder 225, sense component 230). The local memory controller 260 may be an example of the local memory controller 165 described with reference to FIG. 1. In some examples, one or more of the row decoder 220, column decoder 225, and sense component 230 may be co-located with the local memory controller 260. The local memory controller 260 may be operable to receive one or more of commands or data from one or more different memory controllers (e.g., an external memory controller 120 associated with a host device 105, another controller associated with the memory die 200), translate the commands or the data (or both) into information that can be used by the memory die 200, perform one or more operations on the memory die 200, and communicate data from the memory die 200 to a host device 105 based on performing the one or more operations. The local memory controller 260 may generate row signals and column address signals to activate the target row line 210 and the target column line 215. The local memory controller 260 may also generate and control various voltages or currents used during the operation of the memory die 200. In general, the amplitude, the shape, or the duration of an applied voltage or current discussed herein may be varied and may be different for the various operations discussed in operating the memory die 200.

The local memory controller 260 may be operable to perform one or more access operations on one or more memory cells 205 of the memory die 200. Examples of access operations may include a write operation, a read operation, a refresh operation, a precharge operation, or an activate operation, among others. In some examples, access operations may be performed by or otherwise coordinated by the local memory controller 260 in response to various access commands (e.g., from a host device 105). The local memory controller 260 may be operable to perform other access operations not listed here or other operations related to the operating of the memory die 200 that are not directly related to accessing the memory cells 205.

The local memory controller 260 may be operable to perform a write operation (e.g., a programming operation) on one or more memory cells 205 of the memory die 200. During a write operation, a memory cell 205 of the memory die 200 may be programmed to store a desired logic state. The local memory controller 260 may identify a target memory cell 205 on which to perform the write operation. The local memory controller 260 may identify a target row line 210 and a target column line 215 coupled with the target memory cell 205 (e.g., the address of the target memory cell 205). The local memory controller 260 may activate the target row line 210 and the target column line 215 (e.g., applying a voltage to the row line 210 or column line 215)

to access the target memory cell 205. The local memory controller 260 may apply a specific signal (e.g., write pulse) to the column line 215 during the write operation to store a specific state in the storage element of the memory cell 205. The pulse used as part of the write operation may include one or more voltage levels over a duration.

The local memory controller 260 may be operable to perform a read operation (e.g., a sense operation) on one or more memory cells 205 of the memory die 200. During a read operation, the logic state stored in a memory cell 205 of the memory die 200 may be determined. The local memory controller 260 may identify a target memory cell 205 on which to perform the read operation. The local memory controller 260 may identify a target row line 210 and a target column line 215 coupled with the target memory cell 205 (e.g., the address of the target memory cell 205). The local memory controller 260 may activate the target row line 210 and the target column line 215 (e.g., applying a voltage to the row line 210 or column line 215) to access the target memory cell 205. The sense component 230 may detect a signal received from the memory cell 205 that is based on the pulse applied to the row line 210, the pulse applied to the column line, and/or a resistance or threshold characteristic of the memory cell 205. The sense component 230 may amplify the signal. The local memory controller 260 may activate the sense component 230 (e.g., latch the sense component) and thereby compare the signal received from the memory cell 205 to the reference signal 235. Based on that comparison, the sense component 230 may determine a logic state that is stored on the memory cell 205. The pulse used as part of the read operation may include one or more voltage levels over a duration.

To preserve the error correcting abilities of the error correction circuitry, enhanced data storage techniques that store noninverted (e.g., original) or inverted data based on defective memory cell detection may be used. For example, data may be received at a local memory controller 245 for storage in a set of memory cells 205 in a memory array. The data may include a first set of bits that have a first logic value and a second set of bits that have a second logic value. Similarly, the first set of bits may correspond to a first subset of the memory cells 205 and the second set of bits may correspond to a second, non-overlapping subset of the memory cells 205. After receiving the data, the local memory controller 245 may perform a first programming operation that writes the second logic value to each of the memory cells 205 and, in some examples, also verifies whether the second logic value was written to each of the second subset of memory cells 205.

If any of the second subset of memory cells are identified as not storing the second logic value, the local memory controller 245 may perform a second programming operation that writes the first logic value to the second subset of memory cells 205, causing an inverted version of the data to be stored at the set of memory cells 205—e.g., with no or reduced error. In some examples, the second programming operation may also be used to program a control bit (also referred to as a flip bit) to indicate that the set of memory cells 205 is storing inverted data after the second programming operation. Otherwise, if all of the second subset of memory cells 205 are identified as storing the second logic value, the local memory controller 245 may perform a second programming operation that writes the first logic value to the first subset of memory cells 205, causing the non-inverted version of the data (also referred to as the original data) to be stored at the set of memory cells 205. By performing the enhanced data storage procedure, an error that would otherwise be caused by a high-$V_{th}$ or low-$V_{th}$ memory cell may be avoided.

Figure 3:
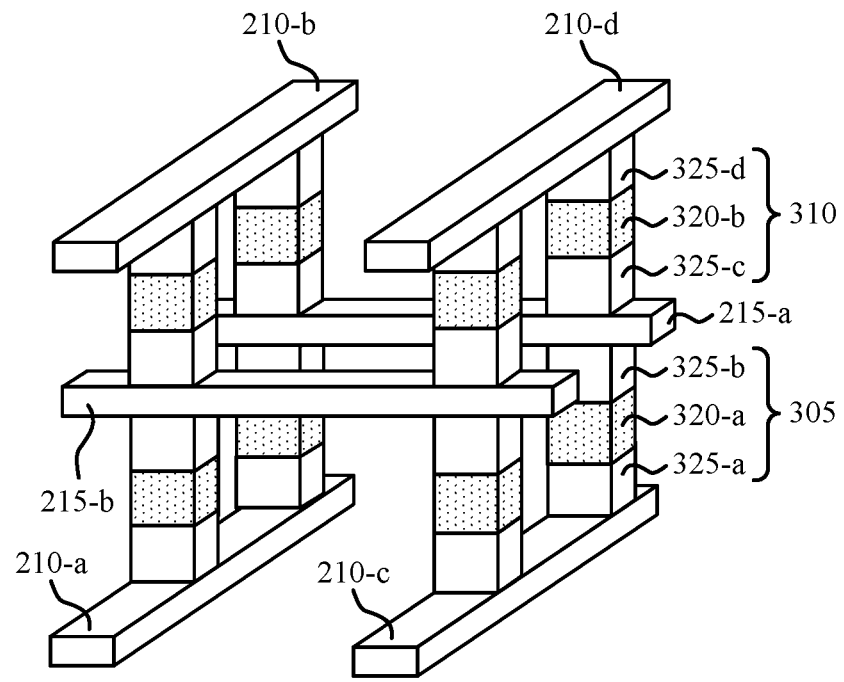
FIG. 3 illustrates an example of memory cells that support techniques for programming self-selecting memory in accordance with examples as disclosed herein.

FIG. 3 illustrates an example of a memory array 300 in accordance with examples as disclosed herein. Memory array 300 may be an example of portions of the memory arrays or memory dies described with reference to FIGS. 1 and 2. The memory array 300 may include a first deck 305 of memory cells that is positioned above a substrate (not shown) and a second deck 310 of memory cells on top of the first array or deck 305. Though the example of memory array 300 includes two decks 305, 310, the memory array 300 may include any quantity of decks (e.g., one or more than two).

Memory array 300 may also include a row line 210-a, a row line 210-b, a row line 210-c, a row line 210-d, a column line 215-a, and a column line 215-b, which may be examples of row lines 210 and column lines 215, as described with reference to FIG. 2. One or more memory cells of the first deck 305 and the second deck 310 may include one or more chalcogenide materials in a pillar between access lines. For example, a single stack between access lines may include one or more of a first electrode, a first chalcogenide material (e.g., selector component), a second electrode, a second chalcogenide material (e.g., storage element), or a third electrode. Although some elements included in FIG. 3 are labeled with a numeric indicator, other corresponding elements are not labeled, although they are the same or would be understood to be similar, in an effort to increase visibility and clarity of the depicted features.

One or more memory cells of the first deck 305 may include one or more of an electrode 325-a, a storage element 320-a, or an electrode 325-b. One or more memory cells of the second deck 310 may include an electrode 325-c, a storage element 320-b, and an electrode 325-d. The storage elements 320 may be examples of a chalcogenide material, such as a phase change storage element, a thresholding storage element, or a self-selecting storage element. The memory cells of the first deck 305 and second deck 310 may, in some examples, have common conductive lines such that corresponding memory cells of one or more decks 305 and one or more decks 310 may share column lines 215 or row lines 210. For example, the first electrode 325-c of the second deck 310 and the second electrode 325-b of the first deck 305 may be coupled with column line 215-a such that the column line 215-a may be shared by vertically adjacent memory cells.

In some examples, the material of the storage element 320 may include a chalcogenide material or other alloy including selenium (Se), tellurium (Te), arsenic (As), antimony (Sb), carbon (C), germanium (Ge), silicon (Si), or indium (IN), or various combinations thereof. In some examples, a chalcogenide material having primarily selenium (Se), arsenic (As), and germanium (Ge) may be referred to as a SAG-alloy. In some examples, a SAG-alloy may also include silicon (Si) and such chalcogenide material may be referred to as SiSAG-alloy. In some examples, SAG-alloy may include silicon (Si) or indium (In) or a combination thereof and such chalcogenide materials may be referred to as SiSAG-alloy or InSAG-alloy, respectively, or a combination thereof. In some examples, the chalcogenide glass may include additional elements such as hydrogen (H), oxygen (O), nitrogen (N), chlorine (Cl), or fluorine (F), each in atomic or molecular forms.

In some examples, the storage element 320 may be an example of a phase change memory cell. In such examples, the material used in the storage element 320 may be based on an alloy (such as the alloys listed above) and may be operated so as to undergo a phase change or change to different physical state during normal operation of the memory cell. For example, a phase change memory cell may have an amorphous state (e.g., a relatively disordered atomic configuration) and a crystalline state (e.g., a relatively ordered atomic configuration).

In some examples, such as for thresholding memory cells or self-selecting memory cells, some or all of the set of logic states supported by the memory cells may be associated with an amorphous state of the chalcogenide material (e.g., the material in a single state may be operable to store different logic states). In some examples, the storage element 320 may be an example of a self-selecting memory cell. In such examples, the material used in the storage element 320 may be based on an alloy (such as the alloys listed above) and may be operated so as to undergo a change to different physical state during normal operation of the memory cell. For example, a self-selecting memory cell may have a high threshold voltage state and a low threshold voltage state. A high threshold voltage state may correspond to a first logic state (e.g., a RESET state) and a low threshold voltage state may correspond to a second logic state (e.g., a SET state).

During a programming (write) operation of a self-selecting memory cell (e.g., including electrode 325-a, storage element 320-a, and electrode 325-b), a polarity used for a write operation may influence (determine, set, program) a particular behavior or characteristic of the material of the storage element 320, such as the threshold voltage of the material. The difference in threshold voltages of the material of the storage element 320 depending on the logic state stored by the material of the storage element 320 (e.g., the difference between the threshold voltage when the material is storing a logic state '0' versus a logic state '1') may correspond to the read window of the storage element 320.

The architecture of memory array 300 may be referred to as a cross-point architecture, in some examples, in which a memory cell is formed at a topological cross-point between a row line 210 and a column line 215. Such a cross-point architecture may offer relatively high-density data storage with lower production costs compared to other memory architectures. For example, the cross-point architecture may have memory cells with a reduced area and, resultantly, an increased memory cell density compared to other architectures. For example, the architecture may have a 4F2 memory cell area, where F is the smallest feature size, compared to other architectures with a 6F2 memory cell area, such as those with a three-terminal selector element. For example, DRAM may use a transistor, which is a three-terminal device, as the selector element for each memory cell and may have a larger memory cell area compared to the cross-point architecture.

While the example of FIG. 3 shows two memory decks, other configurations are possible. In some examples, a single memory deck of memory cells may be constructed above a substrate, which may be referred to as a two-dimensional memory. In some examples, two or more decks of memory cells may be configured in a similar manner in a three-dimensional cross point architecture. Further, in some cases, elements shown in or described with reference to FIG. 3 may be electrically coupled with one another as shown or described but rearranged physically (e.g., a storage element 320 and possibly a selection element or electrode 325 may be electrically in series between a row line 210 and a column line 215 but may not be in a pillar or stack configuration).

A memory device (e.g., the memory device 110 of FIG. 1 or the memory die 200 of FIG. 2) may be configured to store data in the memory array 300. In some examples, the memory device stores, in the memory array 300, data that is received from a host device (e.g., host device 105 of FIG. 1). In some examples, instead of storing the data received from the host device in the memory array, the memory device may store an inverted version of the data received from the host device in the memory array 300—e.g., if the memory device receives a data set {01001001}, the memory device may store the inverted data set {10110110} instead. The memory device may also store an additional bit (also referred to as a flip bit) that is used to indicate whether a stored data set was inverted prior to storage. Inverting data prior to storage may improve an operation of the memory array 300 (e.g., increase a reliability, reduce a power consumption, reduce a read duration, extend a life of memory cells, etc.).

As described herein, applying a programming voltage to a memory cell may result in the memory cell having a particular threshold voltage after the programming operation—e.g., a memory cell may have a first threshold voltage (e.g., around ±6V) if a first programming voltage (e.g., a positive voltage) is applied or a second threshold voltage (around ±3.75V) if a second programming voltage (e.g., a negative voltage) is applied. The first threshold voltage may be associated with a first logic value (e.g., logic value 1) and the second threshold voltage may be associated with a second logic value (e.g., logic value 0). Thus, a logic value may be read from the memory cells by applying an intermediary voltage (e.g., ±4.5V) to the memory cells—e.g., if current flows through a memory cell, the memory cell may be identified as storing logic value 1, and if not, the memory cell may be identified as storing logic value 0.

In some examples, a set of memory cells programmed with the first programming voltage may exhibit a range of threshold voltages—e.g., the threshold voltages of the memory cell may be distributed across a voltage range of ±3.5V through ±4V. Similarly, a set of memory cells programmed with the second programming voltage may exhibit a range of threshold voltages—e.g., the threshold voltages of the memory cell may be distributed across a voltage range of ±5V through ±7V. To accommodate for variations in the threshold voltages, an intermediary read voltage may be selected to be greater than an upper limit of the first threshold voltages (e.g., greater than ±4V) and less than a lower limit of the second threshold voltages (e.g., less than ±5V). Similarly, to accommodate for variations in the threshold voltages, a programming voltage may be selected that is larger than the upper limit of the second threshold voltages (e.g., greater than ±7V). In some examples, the upper limit for the threshold voltages is determined based on a Gaussian distribution out to a seventh sigma. In some examples, all but one memory cell of a set of memory cells storing the second logic value may have a threshold voltage within a range of (e.g., ±5V through ±7V) after a programming operation is performed.

In some examples, one or more memory cells within the memory array 300 are defective, and a memory may respond to a programming voltage in an unexpected manner. For example, a memory cell may have an uncharacteristically low threshold voltage regardless of the programming voltage applied across the memory cell—e.g., the memory cell may have a threshold voltage of less than ±4.5V after the second programming voltage for programming a logic value 0 (e.g., a negative voltage) is applied instead of the second threshold voltage (~±6V). Such a memory cell may be referred to as a low-$V_{th}$ memory cell or a short-circuited memory cell. A low-$V_{th}$ memory cell may be read as a logic value 1 regardless of a magnitude, timing, or polarity of the programming voltage applied across the memory cell.

In another example, a memory cell may have an uncharacteristically high threshold voltage after the second programming voltage for programming a logic value 0 is applied across the memory cell—e.g., the memory cell may have a threshold voltage that exceeds ±7 V after the second programming voltage is applied. In some examples, a memory cell may have an uncharacteristically high threshold voltage regardless of the programming voltage that is applied across the memory cell—e.g., the memory cell may have a threshold voltage of greater than ±7 V after the first programming voltage for programming a logic value 1 (e.g., a positive voltage) is applied instead of the first threshold voltage (around ±3.5V). Such a memory cell may be referred to as a high-$V_{th}$ memory cell or an open-circuited memory cell. Similarly, a high-$V_{th}$ memory cell may be unprogrammable to a different logic state by a programming operation if the threshold voltage of the high-$V_{th}$ memory cell exceeds the programming voltage. Thus, a high-$V_{th}$ memory cell may be read as a logic value 0 regardless of a magnitude, timing, or polarity of the programming voltage applied across the memory cell.

A memory device may use enhanced programming techniques to reduce errors associated with high-$V_{th}$ memory cells—e.g., by using larger programming voltages that accommodate the larger threshold voltages. A memory device may also use error correction techniques (e.g., ECC) that enable data to be stored in memory cell sets that include a limited number of defective cells (e.g., less than 2 defective cells). That is, error correction techniques may be used to detect a limited number of errors in a memory cell set caused by defective cells (and/or other storage failures) and/or to correct all or a portion of the detected errors after the incorrect data is read from the memory cell set. But using larger programming voltages to accommodate high-$V_{th}$ memory cells may increase an energy consumption of a memory device and/or reduce an operating life of the memory cells. Also, using error correction circuitry to detect/correct errors caused by defective memory cells may reduce the quantity of errors the error correction circuity is able to detect/correct that are caused by other programming failures.

To preserve the error correcting abilities of the error correction circuitry, enhanced data storage techniques that store noninverted (e.g., original) or inverted data based on defective memory cell detection may be used. For example, data may be received for storage in a set of memory cells in a memory array. The data may include a first set of bits that have a first logic value and a second set of bits that have a second logic value. In some examples, the first logic value is a logic value 0 and the second logic value is a logic value 1. In other examples, the first logic value is a logic value 1 and the second logic value is a logic value 0. When the first logic value is a logic value 0 and the second logic value is a logic value 1 and for data {01001010}, the first set of bits corresponds to the first, third, fourth, sixth, and eighth bit and the second set of bits corresponds to the second, fifth, and seventh bit. Similarly, the first set of bits may correspond to (e.g., be scheduled to be written to) a first subset of the memory cells and the second set of bits may correspond to (e.g., be scheduled to be written to) a second, non-overlapping subset of the memory cells. After receiving the data, a first programming operation that writes the second logic value to each of the memory cells and, in some examples, also verifies whether the second logic value was written to each of the second subset of memory cells (that is, the subset of memory cells that is intended to store the second logic value based on the received data) may be performed.

If any of the second subset of memory cells are identified as not storing the second logic value (e.g., if one of the second subset of memory cells is a high-$V_{th}$ memory cell), a second programming operation that writes the first logic value to the second subset of memory cells may be performed, causing an inverted version of the data (e.g., second data) to be stored at the set of memory cells—e.g., with no or reduced error. In some examples, the second programming operation may also be used to program a control bit (also referred to as a flip bit) to indicate that the set of memory cells is storing inverted data after the second programming operation. Otherwise, if all of the second subset of memory cells are identified as storing the second logic value, a second programming operation that writes the first logic value to the first subset of memory cells may be performed, causing the non-inverted version of the data (e.g., the original data) to be stored at the set of memory cells. By performing the enhanced data storage procedure, an error that would otherwise be caused by a high-$V_{th}$ or low-$V_{th}$ memory cell (depending on whether the first logic value is a 0 or 1) may be avoided.

The enhanced data storage procedure may also be used to reduce power consumption. For example, a voltage of the programming voltage used by the data storage procedure may be reduced such that the programming voltage is not selected to accommodate memory cells with abnormally high (yet programmable) threshold voltages. In some examples, the programming voltage is selected to accommodate threshold voltages that fall within a six sigma range rather than a seven sigma range of a Gaussian distribution. In such examples, an abnormally high-$V_{th}$ memory cell that is included in the second subset of memory cells may not store the second logic value after the first programming operation is performed, and an inverted version of the data may be stored at the set of memory cell—e.g., with no or reduced error.

In some examples, the enhanced data storage technique may include additional operations after the second programming operation is performed. For example, if the second programming operation writes the first logic value to the first subset of memory cells after determining that all of the second subset of memory cells are identified as storing the second logic value, the second programming operation may also verify whether the first logic state was written to each of the first subset of memory cells. If any of the first subset of memory cells are identified as not storing the first logic value, a third programming operation that write the first logic value to the second subset of memory cells and the second logic value to the first subset of memory cells may be performed, causing an inverted version of the data to be stored at the set of memory cells—e.g., with no or reduced error. In some examples, the third programming operation may also be used to program a flip bit to indicate that the set of memory cells is storing inverted data after the third programming operation. However, if all of the first subset of memory cells are identified as storing the first logic value, the third programming operation may not be performed, causing the non-inverted version of the data to be stored at the memory cells. By performing the additional operations, errors that would otherwise be caused by a high-$V_{th}$ or a low-$V_{th}$ memory cell may be avoided.

Figure 4:
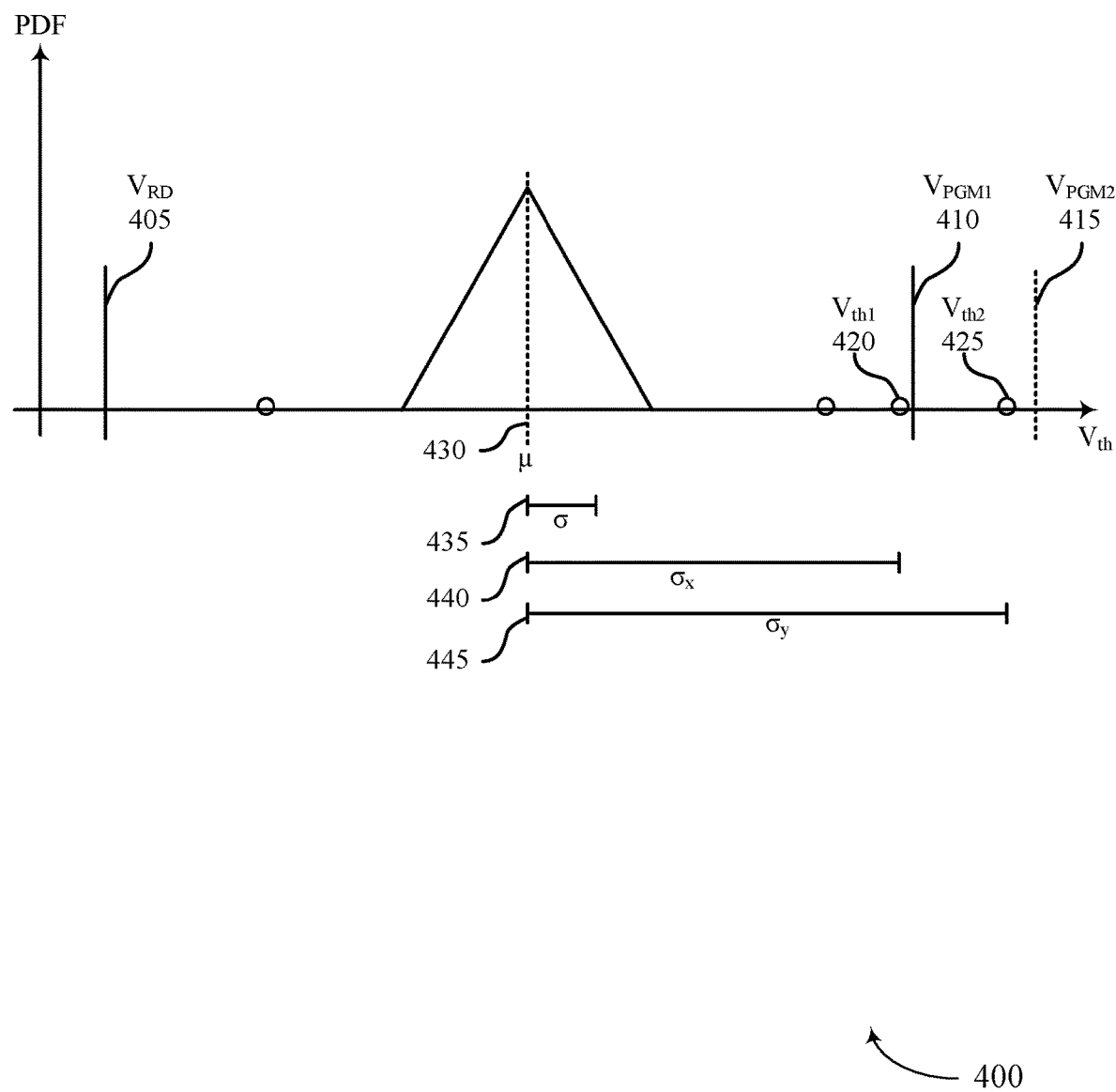
FIG. 4 illustrates an example of a distribution diagram that supports techniques for programming self-selecting memory in accordance with examples as disclosed herein.

FIG. 4 illustrates an example of a distribution diagram that supports techniques for programming self-selecting memory in accordance with examples as disclosed herein.

Distribution diagram 400 depicts a distribution of threshold voltages across multiple memory cells that have been programmed to store a first logic value (e.g., a logic value 0). Distribution diagram 400 may depict a percentage of the memory cells having a particular threshold voltage. In some examples, the threshold voltages are distributed in accordance with a Gaussian distribution and around 68% of the memory cells have threshold voltages within one standard deviation ($\sigma$) of the mean ($\mu$) threshold voltage. And around 99% of the memory cell may have threshold voltages within three standard deviations of the mean threshold voltage. The mean may be represented as mean threshold voltage 430 and a standard deviation may be represented as standard deviation 435.

In some examples, a small number (e.g., one or more) of the memory cells may have threshold voltages that are up to six standard deviations away from the mean and an even smaller number of the memory cells may have threshold voltages that are up to seven standard deviations away from the mean. For example, first threshold voltage 420 of a first memory cell may be within six standard deviations of mean threshold voltage 430 (as represented by sixth sigma 440 and $\sigma_x$), and first threshold voltage 425 may of a second memory cell may be within seven standard deviations of mean threshold voltage 430 (as represented by seventh sigma 445 and $\sigma_y$). In some examples, one or more memory cells may have threshold voltages that are farther than seven standard deviations away from mean threshold voltage 430—e.g., defective memory cells that operate as an open circuit.

In some examples, memory cells having threshold voltages that are more than three standard deviations away from mean threshold voltage 430 are referred to as high-$V_{th}$ memory cells. Depending on a magnitude of the programming voltage used to program a logic state of the memory cells within a memory array, high-$V_{th}$ memory cells may store a particular logic value (e.g., logic value 0) indefinitely after being programmed to store that logic value—e.g., if the threshold voltage of the memory cell exceeds the programming voltage used to program memory cells within the memory array. To accommodate high-$V_{th}$ memory cells (e.g., to ensure that high-$V_{th}$ memory cells can be used to store data), a programming voltage that exceeds an upper voltage limit may be used. For example, second programming voltage 415 may be used to accommodate high-$V_{th}$ memory cells that have threshold voltages that are up to seven standard deviations larger than mean threshold voltage 430. Otherwise, if first programming voltage 410 were used, then the memory cell associated with first threshold voltage 425 may be indefinitely programmed (or "stuck") in a logic state associated with a particular logic value (e.g., logic value 0)—e.g., because first programming voltage may not be sufficiently large to reprogram the memory cell having first threshold voltage 425. In some examples, a controller may determine an upper threshold voltage of the memory cells in a memory array when storing a particular logic value (e.g., logic value 0) before performing a programming operation—e.g., by applying an increasing voltage across the memory cells.

Similarly, one or more memory cells may have threshold voltages that are more than three standard deviations less than mean threshold voltage 430 when storing a particular logic state (e.g., logic value 0). Read voltage 405 may be configured to be three or more standard deviations less than mean threshold voltage 430 to accommodate memory cells in the memory array having the lower threshold voltages when storing that logic state. In some examples, read voltage 405 may also be three or more standard deviations higher than a mean threshold voltage associated with memory cells storing a different logic value (e.g., logic value 1). In some examples, a memory cell that has been programmed to store the particular logic value (e.g., logic value 0) may have a threshold voltage that is lower than a voltage of read voltage 405. In such cases, the memory cell may indefinitely be sensed as storing the different logic value (e.g., logic value 1)—that is the memory cell may be stuck storing the different logic value. Such a memory cell may be referred to as a low-$V_{th}$ memory cell. In some examples, a low-$V_{th}$ memory cell may operate as a short circuit.

As described herein and with more detail with reference to FIGS. 5 through 9, to prevent high-$V_{th}$ memory cells and/or low-$V_{th}$ memory cells from hindering an operation of a memory array, an enhanced programming operation may be performed that checks for defective memory cells and potentially writes an inverted set of data to a set of memory cells that includes defective memory cells. For example, the enhanced programming operation identifies a first subset of the set of memory cells that is scheduled to store a first logic value and a second subset of the set of memory cells that is scheduled to store a second logic value. The programming operation then writes the first logic value to each memory cell of the set of memory cells and checks if any memory cells of the subset of the memory cells stores the second logic value after the write operation completes. If so, the programming operation writes the different logic value to the first subset of the memory cells. In some examples, the first logic value is a logic value 1 and the second logic value is a logic value 0. In other examples, the first logic value is a logic value 0 and the second logic value is a logic value 1.

In cases where the first logic value is a logic value 1, the enhanced programming operation may determine that a memory cell of the subset of the memory cells that stores a logic value 0 after the first write operation is a high-$V_{th}$ memory cell. Thus, instead of trying to reprogram the high-$V_{th}$ memory cell to store a logic value 1 (e.g., by applying a larger programming voltage), the enhanced programming operation may enable the high-$V_{th}$ memory cell to continue storing the logic value 0 by writing the logic value 0 to the subset of the memory cells and leaving the second subset of memory cells storing the logic value 1. Accordingly, the first subset of memory cells that was originally scheduled to store logic value 1 may instead store logic value 0 and the second subset of memory cells that was originally scheduled to store logic value 0 may instead store logic value 1—that is, the data stored by the set of memory cells after the enhanced programming operation is completed may be an inverted version of the original data received for storage in the memory cells. By not reprogramming high-$V_{th}$ memory cells, the enhanced programming operation may use lower programming voltages, such as first programming voltage 410, without causing storage errors.

Figure 5:
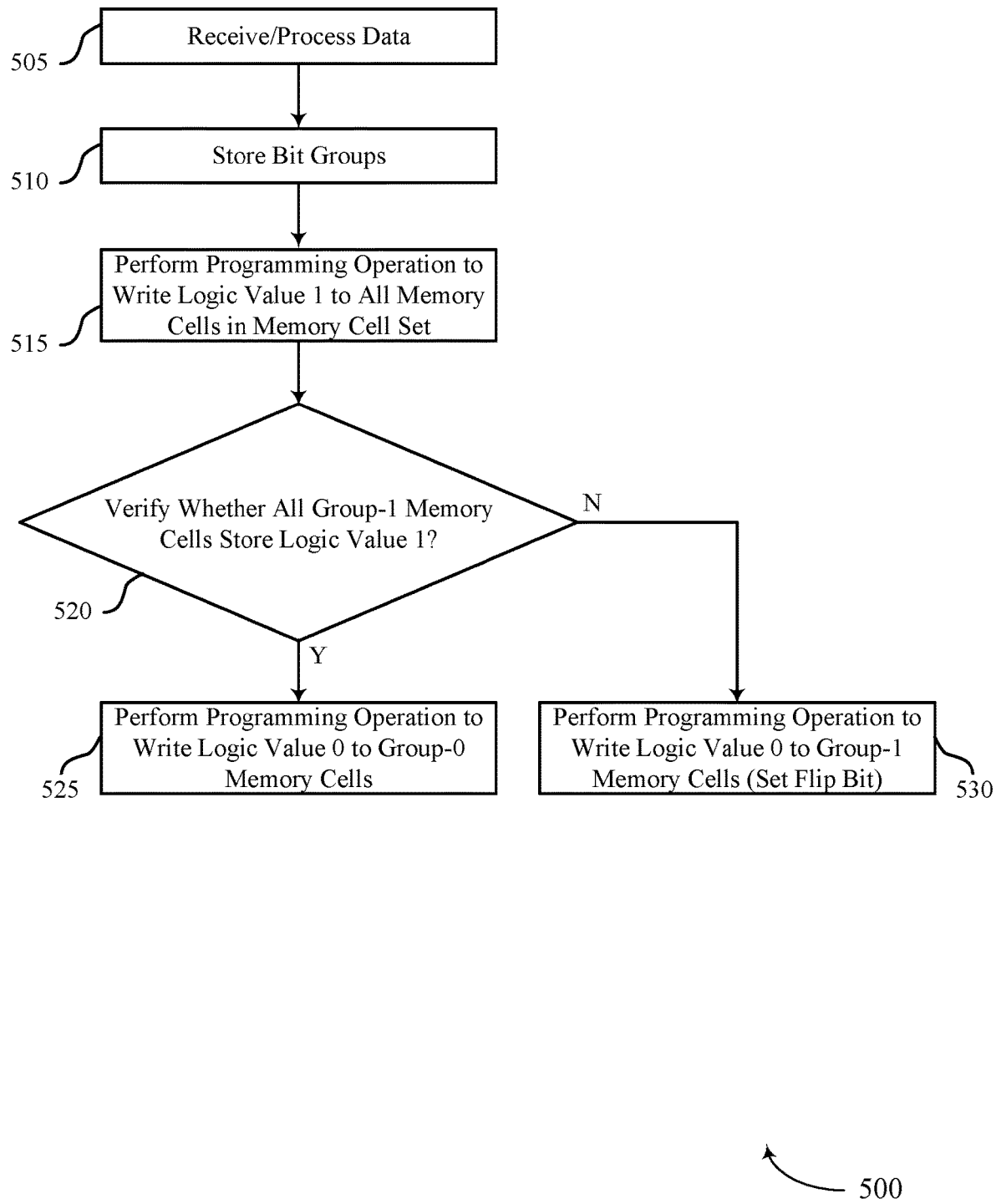
FIG. 5 illustrates an example of a flowchart that supports techniques for programming self-selecting memory in accordance with examples as disclosed herein.

FIG. 5 illustrates an example of a flowchart that supports techniques for programming self-selecting memory in accordance with examples as disclosed herein. Flowchart 500 illustrates operations that support an enhanced programming operation with reference to a set of operations for programming a set of memory cells. Flowchart 500 may illustrate operations that are used to correct errors caused by high-$V_{th}$ memory cells. One or more of the operations of flowchart 500 may be performed by a controller. Operations of flowchart 500 may be rearranged, omitted, or modified without loss of operation.

At block 505, a set of data (or codeword) may be received (e.g., at a controller) for storage in a set of memory cells. The set of data may include multiple bits (e.g., 8, 16, 32, 64, 128, 256 bits). A first subset (or portion) of the bits may represent a first logic value (e.g., logic value 0) and a second subset (or portion) of the bits may represent a second logic value (e.g., logic value 1). A controller may determine which bit positions of the set of data store which logic values and may group the first portion of the bits into a first group (also referred to as "Group-0 bits") and the second portion of the bits into a second group (also referred to as "Group-1 bits"). The first group of bits may correspond to (be intended for storage in) a first subset of the set of memory cells (also referred to as "Group-0 memory cells"). The second group of bits may correspond to (be intended for storage in) a second subset of the set of memory cells (also referred to as "Group-1 memory cells").

At block 510, the first subset of bits may be stored in a first register and the second subset of bits may be stored in a second register. In some examples, the subsets of bits may be stored in positions within the register that correspond to a position of the bits within the received set of data (or codeword). The stored bits may be used later to write data to the set of memory cells.

At block 515, a first programming operation may be performed. The first programming operation may include performing an operation for writing the logic value 1 to the memory cells in the set of memory cells. In some examples, the operation for writing the logic value 1 to the memory cells includes applying a positive voltage across the memory cells.

At diamond 520, an operation for verifying whether all of the memory cells in the Group-1 memory cells store the logic value 1 after the first programming operation may be performed. In some examples, the verification is performed as a part of the first programming operation (e.g., using a current mirror circuit). If all of the Group-1 memory cells store the logic value 1 after the write operation, it may be determined that the Group-1 memory cells do not include any high-$V_{th}$ memory cells. Accordingly, the procedure may proceed to block 525. Otherwise, if one or more of the Group-1 memory cells stores the logic value 0 after the write operation, it may be determined that the one or more Group-1 memory cells are high-$V_{th}$ memory cells that will be read as storing a logic value 0 regardless of a prior programming operation. Accordingly, the procedure may proceed to block 530.

At block 525, a second programming operation may be performed that includes performing an operation for writing the logic value 0 to all of the Group-0 memory cells and preserving the logic value 1 stored by the Group-1 memory cells. In some examples, the operation for writing the logic value 0 to the Group-0 memory cells includes applying a negative voltage across the Group-0 memory cells. A controller may refrain from programming the Group-1 memory cells which have each been identified as storing the logic value 1 written by the first programming operation. As a result of the second programming operation performed at block 525, the set of data stored by the set of memory cells may be consistent with the set of data received at block 505.

At block 530, a second programming operation may be performed that includes performing an operation for writing the logic value 0 to the Group-1 memory cells. The controller may refrain from programming the Group-0 memory cells; thus, the Group-0 memory cells may continue to store the logic value 1 written by the first programming operation. As a result of the second programming operation performed at block 530, the set of data stored by the set of memory cells may be inverted relative to the set of data received at block 505. By writing the logic value 0 to the Group-1 memory cells and preserving the logic value 1 at the Group-0 memory cells, an error that would otherwise be introduced by the one or more high-$V_{th}$ Group-1 memory cells may be avoided—e.g., because the high-$V_{th}$ Group-1 memory cells are used to store a logic value 0 instead of the originally intended logic value 1.

To enable the correct data (e.g., the original set of data) to be read from the set of memory cells during a subsequent read operation, a bit (also referred to as a flip bit) that indicates whether the data stored by the set of memory cells has been inverted may be set to indicate that the set of memory cells stores inverted data. In some examples, the flip bit is set to indicate that the set of memory cells stores inverted data as a part of the second programming operation—e.g., by also writing a logic value 0 to the flip bit.

In both cases, the enhanced programming operation may bypass one or more errors that may have otherwise been caused by a high-$V_{th}$ memory cell (or the low-$V_{th}$ memory cell, as the case may be). That is, after determining that each of the Group-1 memory cells stores a logic value 1 after the first programming operation, the Group-0 memory cells are programmed to store the logic value 0 during the second programming operation. Thus, regardless of a result of the second programming operation, any high-$V_{th}$ Group-0 memory cells will be properly read as storing a logic value 0. Also, after determining that one or more of the Group-1 memory cells stores a logic value 0 after the first programming operation, the Group-1 memory cells are programmed to store the logic value 0 during the second programming operation. Thus, the Group-1 memory cells, including the one or more high-$V_{th}$ Group-1 memory cells, will be properly read as storing a logic value 0, bypassing any errors that would have been caused by attempting to store a logic value 1 in the one or more high-$V_{th}$ Group-1 memory cells.

Figure 6:
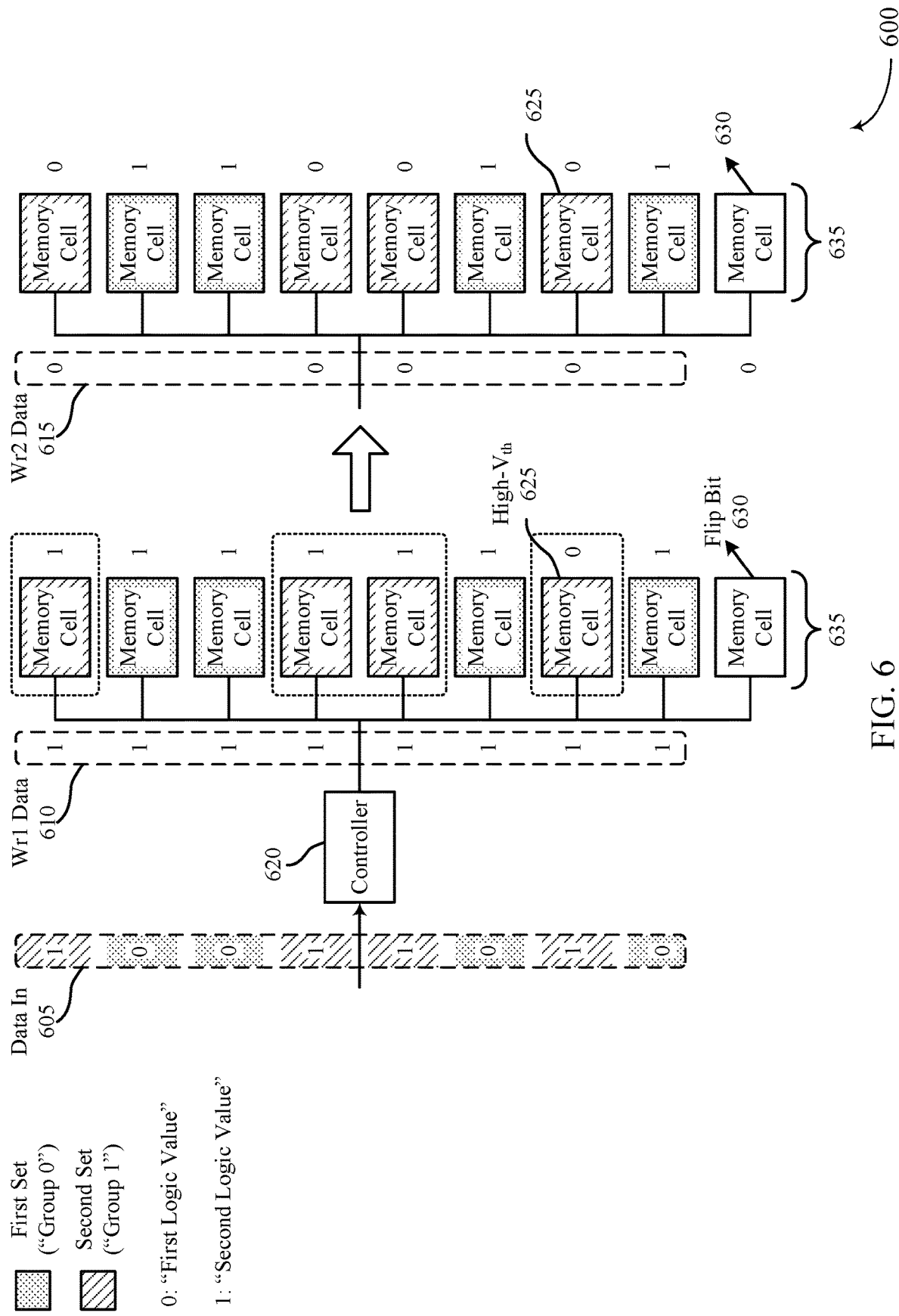
FIG. 6 illustrates an example of a timing diagram that supports techniques for programming self-selecting memory in accordance with examples as disclosed herein.

FIG. 6 illustrates an example of a timing diagram that supports techniques for programming self-selecting memory in accordance with examples as disclosed herein. Timing diagram 600 may be described in the context of a memory device that includes controller 620 and memory cell set 635. Controller 620 may be configured to execute procedures for reading from and writing to memory cell set 635.

Memory cell set 635 may be programmable to store data. Memory cell set 635 may include one or more memory cells. Memory cell set 635 may include a first group of memory cells (indicated in FIG. 6 by the dotted pattern) and a second group of memory cells (indicated in FIG. 6 by the diagonal-line pattern). Memory cell set 635 may also include a memory cell that stores the flip bit 630. Flip bit 630 may be used to indicate whether the other memory cells in memory cell set 635 store inverted or non-inverted data.

The first group of memory cells may correspond to a first set of bits that compose a portion of input data 605, the first set of bits each representing a first logic value (e.g., logic value 0). That is, the first group of memory cells may be intended to store the first set of bits. The second group of memory cells may correspond to a second set of bits that compose a second portion of input data 605, the second set of bits each representing a second logic value (e.g., logic value 1). That is, the second group of memory cells may be intended to store the second set of bits. To show the correspondence between the first set of bis and the first group of memory cells, the first set of bits and the first group of memory cells are indicated using the dotted pattern. Similarly, to show the correspondence between the second set of bits and the second group of memory cells, the second set of bits and the second group of memory cells are indicated using the diagonal pattern. The first group of memory cells may be referred to as Group-0 memory cells and the first group of bits may be referred to as Group-0 bits. Also, the second group of memory cells may be referred to as Group-1 memory cells and the second group of bits may be referred to as Group-1 bits.

In some examples, input data 605 is received at controller 620. Input data 605 may include a set of bits {10011010}, where the first bit may correspond to (e.g., be intended for storage in) the topmost memory cell of memory cell set 635, the second bit may correspond to (e.g., be scheduled for storage in) the memory cell of the memory cell set 635 that is second from the top, and so on. Controller 620 may identify the bits of input data 605 that store logic value 0 and the bits of input data 605 that store logic value 1.

Controller 620 may then perform a first programming operation that includes writing first data 610 to memory cell set 635. First data 610 may include a set of bits that each represent the logic value 1. After performing the first programming operation, or as part of the first programming operation, controller 620 may perform a verification operation that verifies whether each memory cell of the second group of memory cells stores the logic value 1 (as indicated by the dotted lines surrounding the second group of memory cells). As depicted in FIG. 6, memory cell set 635 may include defective memory cell 625 (which may be a high-$V_{th}$ memory cell) that stores a logic value 0 after the first programming operation is performed. Thus, controller 620 may determine that the second group of memory cells includes a high-$V_{th}$ memory cell after the first programming operation is performed.

After determining that the second group of memory cells includes a high-$V_{th}$ memory cell, the controller 620 may perform a second programming operation that includes writing second data 615 to memory cell set 635. Second data 615 may include a set of bits that each represent the logic value 0. A quantity of bits included in second data 615 may be less than a quantity of bits included in input data 605 and first data 610. In some examples, writing second data 615 to memory cell set 635 may include writing the logic value 0 to the second group of memory cells, while refraining from applying a programming voltage across the first group of memory cells. Accordingly, after the second programming operation is performed, the first group of memory cells (the Group-0 memory cells) may continue to store the logic value 1 written during the first programming operation, and the second group of memory cells (the Group-1 memory cells) may be programmed to store the logic value 0. Thus, memory cell set 635 may store data that is an inverted version of input data 605 after the second programming operation is performed.

In some examples, as part of the second programming operation, the memory cell that stores the flip bit 630 bit may be programmed to store a value that indicates that the other memory cells in memory cell set 635 are storing inverted data. In other examples, the memory cell that stores the flip bit 630 is programmed to store a logic value 0 during the second programming operation, where the logic value 0 may be used to indicate the stored data is inverted. In some examples, the memory cell that stores the flip bit 630 is programmed to store a logic value 1 during the second programming operation, where the logic value 1 may be used to indicate the stored data is inverted.

When data is retrieved from memory cell set 635, the controller may read the memory cell that stores the flip bit 630 to determine whether the retrieved data is inverted. If flip bit 630 indicates that the retrieve data is inverted, the controller may invert the retrieved data to obtain input data 605. In some examples, after inverting the retrieved data, one or more errors remain in the inverted data (e.g., errors caused by storage failures that are unrelated to high-$V_{th}$ memory cells). In such cases, the controller may perform an error correction procedure to detect and/or correct the remaining errors before outputting a data set that matches the originally received input data 605.

In another example, if memory cell set 635 does not include any high-$V_{th}$ memory cells, or if the occurrence of high-$V_{th}$ memory cells is limited to the first group of memory cells, controller 620 may perform a second programming operation that writes the logic value 0 to the first group of memory cells (the Group-0 memory cells) and preserves the logic value 1 stored at the second group of memory cells (the Group-1 memory cells). In such examples, the data stored at memory cell set after the second programming operation may be consistent with input data 605.

Figure 7:
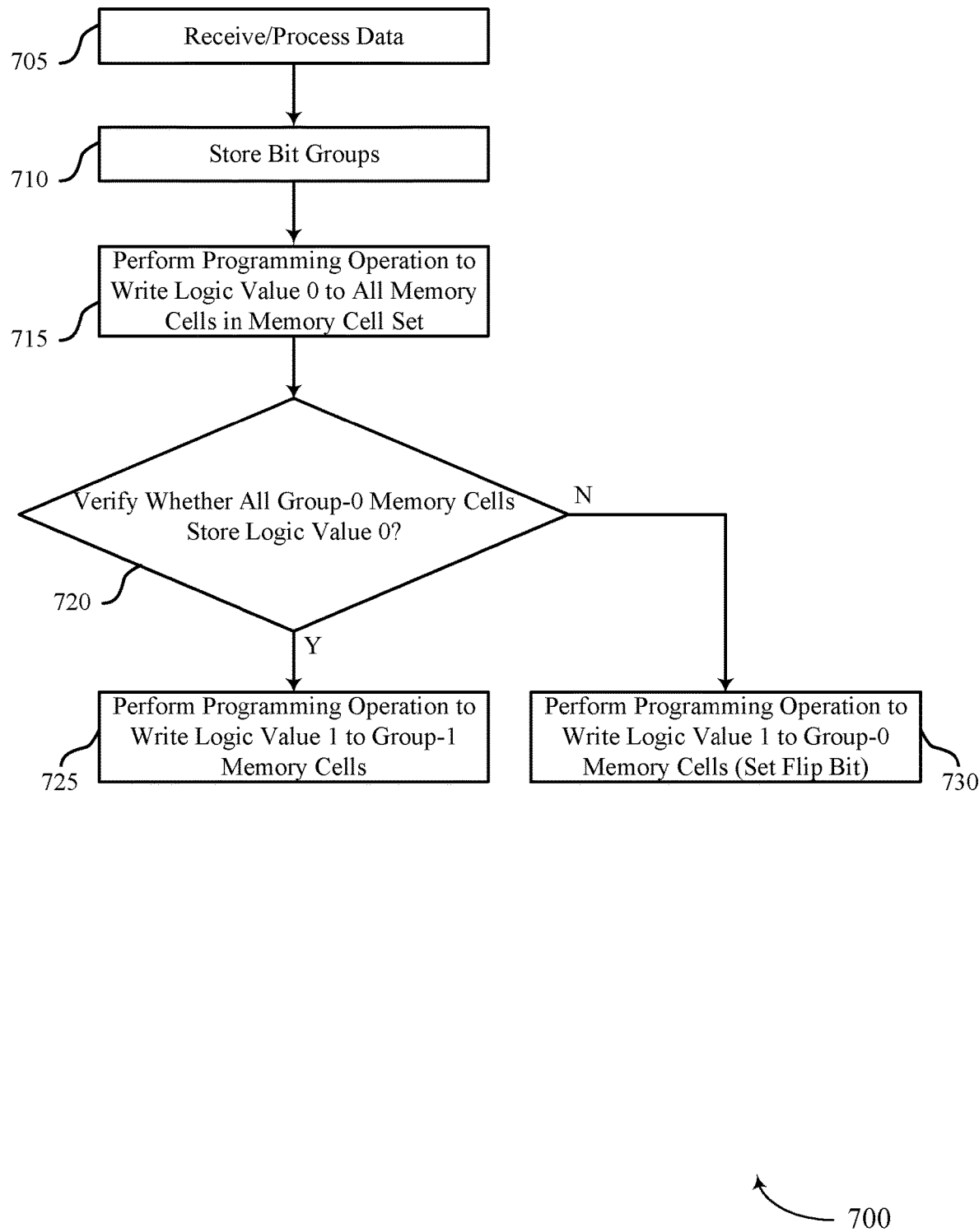
FIGS. 7 and 8 illustrate example flowcharts that support techniques for programming self-selecting memory in accordance with examples as disclosed herein.

FIG. 7 illustrates an example of a flowchart that supports techniques for programming self-selecting memory in accordance with examples as disclosed herein. Flowchart 700 illustrates operations that support an enhanced programming operation with reference to a set of operations for programming a set of memory cells. Flowchart 700 may illustrate operations that are used to correct errors caused by low-$V_{th}$ memory cells. One or more of the operations of flowchart 700 may be performed by a controller. Operations of flowchart 700 may be rearranged, omitted, or modified without loss of operation.

Flowchart 700 may mirror aspects of flowchart 500, as described with reference to FIG. 5. For example, at block 705, a first set of data may be received and processed as similarly described with reference to block 505 of FIG. 5. At block 710, a first group of memory bits and a second group of memory bits may be stored as similarly described with reference to block 510 of FIG. 5.

Also, at block 715, a first programming operation may be performed to write a logic value 0 to a set of memory cells including a first subset of memory cells (Group-0 memory cells) and a second subset of memory cells (Group-1 memory cells), as similarly described with reference to block 515 of FIG. 5 (except that in FIG. 5, a logic value 1 is written to the set of memory cells).

At diamond 720, an operation for verifying whether all of the memory cells in the Group-0 memory cells store the logic value 0 after (or as part of) the first programming operation, as similarly described with reference to diamond 520 of FIG. 5 (except that in FIG. 5, the verification operation verifies whether the second subset of memory cells store the logic value 1). If all of the Group-0 memory cells store the logic value 0, the procedure may proceed to block 725. Otherwise, it may be determined that one or more of the Group-0 memory cells are low-$V_{th}$ memory cells that store a logic value 1 regardless of a prior programming operation, and the procedure may proceed to block 730.

At block 725, a second programming operation may be performed for writing the logic value 1 to the Group-1 memory cells and preserving the logic value 0 stored at all of the Group-0 memory cells, as similarly described with reference to block 525 of FIG. 5 (except that in FIG. 5, the logic value 0 is written to the first subset of memory cells). Accordingly, the set of data stored by the set of memory cells may be consistent with the set of data received at block 705.

At block 730, a second programming operation may be performed for writing the logic value 1 to the Group-0 memory cells and preserving the logic value 0 stored at the Group-1 memory cells, as similarly described with reference to block 530 of FIG. 5 (except that in FIG. 5, the logic value 0 is written to the second subset of memory cells). As a result of the second programming operation at block 730, the set of data stored by the Group-0 memory cells may be inverted relative to the set of data received at block 705. By writing the logic value 1 to the Group-0 memory cells and preserving the logic value 0 at the Group-1 memory cells, an error that would otherwise be introduced by the one or more low-$V_{th}$ Group-0 memory cells may be avoided—e.g., because the low-$V_{th}$ Group-0 memory cells are used to store a logic value 1 instead of the originally scheduled logic value 0.

To enable the correct data (e.g., the original set of data) to be read from the set of memory cells during a subsequent read operation, a bit (also referred to as a flip bit) that indicates whether the data stored by the set of memory cells has been inverted may be set to indicate that the set of memory cells stores inverted data. In some examples, the flip bit is set to indicate that the set of memory cells stores inverted data as a part of the second programming operation—e.g., by also writing a logic value 1 to the flip bit.

In both cases, the enhanced programming operation may bypass one or more errors that may have otherwise been caused by a low-$V_{th}$ memory cell. That is, after determining that each of the Group-0 memory cells stores a logic value 0 after the first programming operation, the Group-1 memory cells are programmed to store the logic value 1 during the second programming operation. Thus, regardless of a result of the second programming operation, any low-$V_{th}$ Group-1 memory cells will be properly read as storing a logic value 1. Also, after determining that one or more of the Group-0 memory cells stores a logic value 1 after the first programming operation, the Group-0 memory cells are programmed to store the logic value 1 during the second programming operation. Thus, the Group-0 memory cells, including the low-$V_{th}$ Group-0 memory cells, will be properly read as storing a logic value 1, bypassing any errors that would have been caused by attempting to store a logic value 0 in the low-$V_{th}$ Group-0 memory cells.

The illustration shown in FIG. 6 may also be used (with minor revisions) to illustrate the performance of the operations described in flowchart 700. That is, to illustrate the performance of the operations described in flowchart 700, first data 610 may be modified to include only the logic value 0, and memory cell set 635 may include a low-$V_{th}$ memory cell in Group-0 memory cells instead of including the high-$V_{th}$ memory cell in the Group-1 memory cells. Thus, the low-$V_{th}$ Group-0 memory cell may store a logic value 1 after the programming operation, and the remaining memory cells may store the logic value 0. Accordingly, to prevent the low-$V_{th}$ Group-0 memory cell from causing storage errors, a second programming operation may be performed for writing the logic value 1 to each of the memory cells included in the first group of memory cells, while preserving the logic value 0 stored at the Group-1 memory cells. To enable the inverted data to be read from memory cell set 635, the memory cell storing the flip bit 630 may be programmed to indicate that the remaining memory cells in memory cell set 635 are storing inverted data—e.g., by writing a logic value 0 to the memory cell.

In another example, if the memory cell set 635 does not include any low-$V_{th}$ memory cells, or if the occurrence of low-$V_{th}$ memory cells is limited to the Group-1 memory cells, controller 620 may perform a second programming operation that writes the logic value 1 to the Group-1 memory cells and preserves the logic value 0 stored at the Group-0 memory cells. In such examples, the data stored at memory cell set after the second programming operation may be consistent with input data 605.

In some examples, in the context of FIG. 7, the logic value 0 may be referred to as the second logic value, the logic value 1 may be referred to as the first logic value, the Group-0 memory cells may be referred to as the second subset of memory cells, and the Group-1 memory cells may be referred to as the first subset of memory cells.

Figure 8:
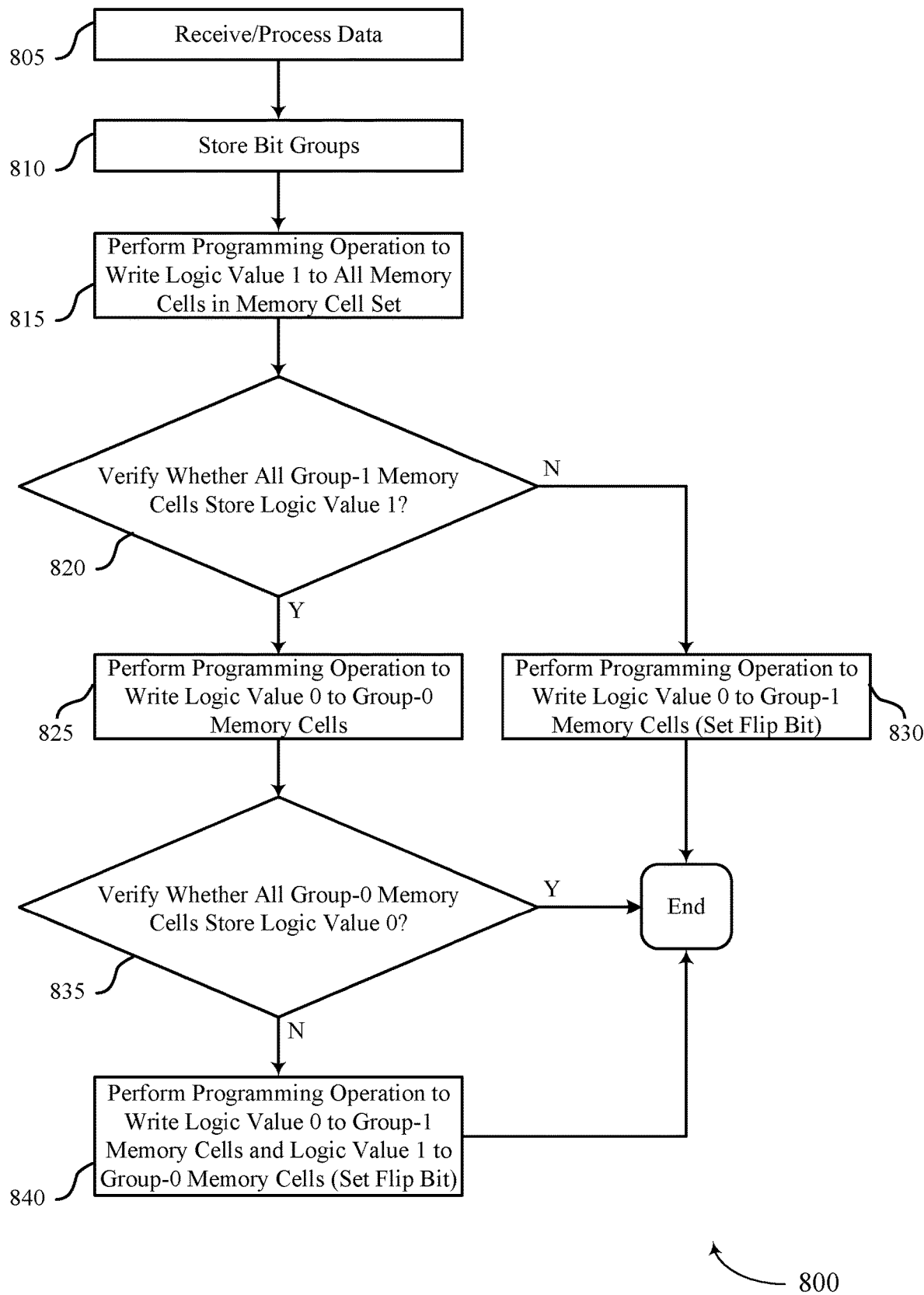

FIG. 8 illustrates an example of a flowchart that supports techniques for programming self-selecting memory in accordance with examples as disclosed herein.

Flowchart 800 illustrates operations that support an enhanced programming operation with reference to a set of operations for programming a set of memory cells. Flowchart 800 may illustrate operations that are used to correct errors caused by low-$V_{th}$ memory cells and/or high-$V_{th}$ memory cells. One or more of the operations of flowchart 800 may be performed by a controller. Operations of flowchart 800 may be rearranged, omitted, or modified without loss of operation.

Flowchart 800 may mirror aspects of flowchart 500, as described with reference to FIG. 5. For example, at block 805, a first set of data may be received and processed, as similarly described with reference to block 505 of FIG. 5. At block 810, a first group of memory bits and a second group of memory bits may be stored, as similarly described with reference to block 510 of FIG. 5. At block 815, a first programming operation for writing a logic value 1 to a set of memory cells that includes a first subset of memory cells (also referred to as Group-0 memory cells) and a second subset of memory cells (also referred to as Group-1 memory cells) may be performed, as similarly described with reference to block 515 of FIG. 5.

At diamond 820, an operation for verifying whether all the of memory cells of the Group-1 memory cells store a logic value 1 after the programming operation may be performed, as similarly described with reference to diamond 520 of FIG. 5. If all of the Group-1 memory cells store the logic value 1, the procedure may proceed to block 825 and perform a second programming operation that writes a logic value 0 to the Group-0 memory cells, as similarly described with reference to block 525 of FIG. 5.

Otherwise, if one or more of the Group-1 memory cells stores the logic value 0, the procedure may proceed to block 830 and perform a second programming operation that writes the logic value 0 to the Group-1 memory cells and preserves the storage of the logic value 1 at the Group-0 memory cells, as similarly described with reference to block 530 of FIG. 5. Also, at block 830, a flip bit may be programmed (e.g., as part of the second programming operation) to indicate that the set of memory cells store inverted data, as similarly described with reference to block 530 of FIG. 5. Accordingly, errors caused by high-$V_{th}$ memory cells included in the Group-1 memory cells may be avoided. After performing the operations associated with block 825, the procedure may proceed to diamond 835.

At diamond 835, an operation for verifying whether all of the Group-0 memory cells store the logic value 0 after the second programming operation may be performed. In some examples, it may be verified whether all of the Group-0 memory cells store the logic value 0 as part of the second programming operation. If all of the Group-0 memory cells store the logic value 0, then the enhanced programming procedure may terminate. That is, if all of the Group-0 memory cells store the logic value 0, it may be determined that, if there are any defective memory cells included in the Group-0 memory cells, such defective memory cells are high-$V_{th}$ memory cells that will be read as storing a logic value 0 regardless of a prior programming operation. Otherwise, the procedure may proceed to block 840—e.g., after determining that one or more of the Group-0 memory cells is a low-$V_{th}$ memory cell that stores a logic value 1 regardless of a prior programming operation.

At block 840, a third programming operation for writing the logic value 0 to the Group-1 memory cells and the logic value 1 to the Group-0 memory cells may be performed. Accordingly, the set of memory cells may store data that is inverted relative to the data received at block 805. A flip bit that is used to indicate whether the data stored by the set of memory cells has been inverted may also be indicated—e.g., as part of the third programming operation.

Accordingly, the operations described in flowchart 800 may be used to accommodate high-$V_{th}$ memory cells included in the Group-1 memory cells when it is determined at diamond 820 that one or more of the Group-1 memory cells store a logic value 0. May be used to accommodate high-$V_{th}$ memory cells included in the Group-0 memory cells when it is determined at diamond 820 that all of the Group-1 memory cells store a logic value 1 and, at diamond 835, that all of the Group-0 memory cells store a logic value 0. And may be used to accommodate low-$V_{th}$ memory cells included in the Group-0 memory cells when it is determined at diamond 820 that all of the Group-1 memory cells stores a logic value 1 and, at diamond 835, that one or more of the Group-0 memory cells stores a logic value 1.

Figure 9:
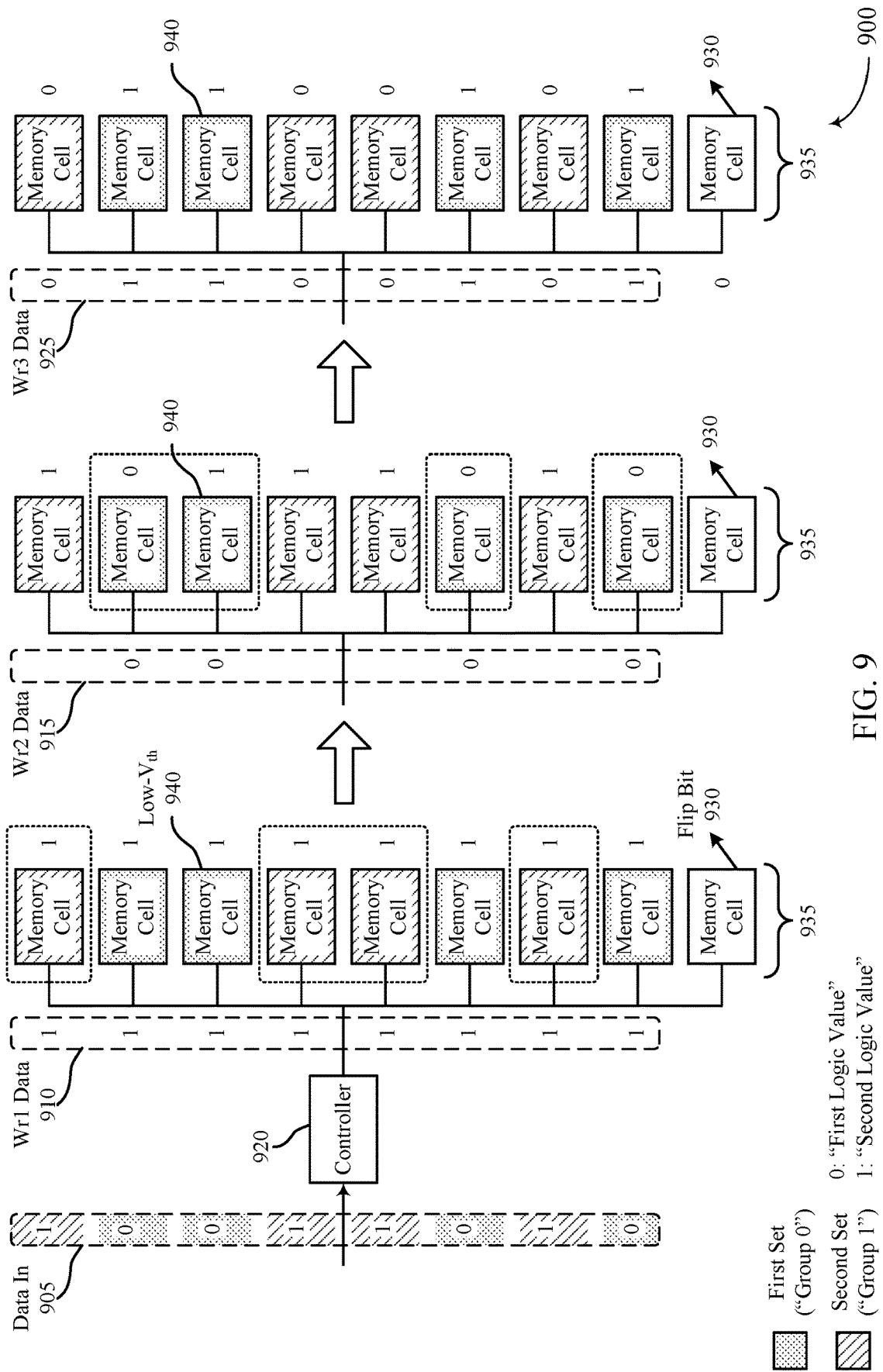
FIG. 9 illustrates an example of a timing diagram that supports techniques for programming self-selecting memory in accordance with examples as disclosed herein.

FIG. 9 illustrates an example of a timing diagram that supports techniques for programming self-selecting memory in accordance with examples as disclosed herein.

Timing diagram 900 may be described in the context of a memory device that includes controller 920 and memory cell set 935. Controller 920 may be configured to execute procedures for reading from and writing to memory cell set 935, and may be an example of controller 620 of FIG. 6.

Memory cell set 935 may be programmable to store data. Memory cell set 935 may include one or more memory cells. Memory cell set 935 may include a first group of memory cells (indicated in FIG. 9 by the dotted pattern) and a second group of memory cells (indicated in FIG. 9 by the diagonal-line pattern). Memory cell set 935 may also include a memory cell that stores the flip bit 930. Flip bit 930 may be used to indicate whether the other memory cells in memory cell set 935 store inverted or non-inverted data.

The first group of memory cells may correspond to a first set of bits that compose a first portion of input data 905, the first set of bits each representing a first logic value (e.g., logic value 0). That is, the first group of memory cells may be intended to store the first set of bits. The second group of memory cells may correspond to a second set of bits that compose a second portion of input data 905, the second set of bits each representing a second logic value (e.g., logic value 1). That is, the second group of memory cells may be intended to store the second set of bits. To show the correspondence between the first set of bis and the first group of memory cells, the first set of bits and the first group of memory cells are indicated using the dotted pattern. Similarly, to show the correspondence between the second set of bits and the second group of memory cells, the second set of bits and the second group of memory cells are indicated using the diagonal pattern. The first group of memory cells may be referred to as Group-0 memory cells and the first group of bits may be referred to as Group-0 bits. Also, the second group of memory cells may be referred to as Group-1 memory cells and the second group of bits may be referred to as Group-1 bits.

In some examples, input data 905 is received at controller 920. Input data 905 may include a set of bits {10011010}, where the first bit may correspond to (e.g., be intended for storage in) the topmost memory cell of memory cell set 935, the second bit may correspond to (e.g., be scheduled for storage in) the memory cell of the memory cell set 935 that is second from the top, and so on. Controller 920 may identify the bits of input data 905 that store logic value 0 and the bits of input data 905 that store logic value 1.

Controller 920 may then perform a first programming operation that includes writing first data 910 to memory cell set 935. First data 910 may include a set of bits that each represent the logic value 1. After performing the first programming operation, or as part of the first programming operation, controller 920 may perform a verification operation that verifies whether each memory cell of the second group of memory cells stores the logic value 1 (as indicated by the dotted lines surrounding the second group of memory cells). As depicted in FIG. 9, memory cell set 935 may include defective memory cell 940 (which may be a low-$V_{th}$ memory cell) that is included in the first group of memory cells and stores a logic value 1 after the first programming operation is performed. Thus, controller 920 may determine that the second group of memory cells either does not include any defective memory cells or includes a low-$V_{th}$ memory cell after the first programming operation is performed.

After determining that each of the second group of memory cells stores a logic value 1, the controller 920 may perform a second programming operation that includes writing second data 915 to memory cell set 935. Second data 915 may include a set of bits that each represent the logic value 0. A quantity of bits included in second data 915 may be less than a quantity of bits included in input data 905 and first data 910. In some examples, writing second data 915 to memory cell set 935 may include writing the logic value 0 to the first group of memory cells, while refraining from applying a programming voltage across the second group of memory cells. Accordingly, after the second programming operation is performed, the second group of memory cells (the Group-1 memory cells) may continue to store the logic value 1 written during the first programming operation. And all of the first group of memory cells (the Group-0 memory cells), except for defective memory cell 940, may store the logic value 0 written during the second programming operation. Thus, controller 920 may determine that the first group of memory cells includes a low-$V_{th}$ memory cell after the second programming operation is performed.

After determining that the first group of memory cells includes a low-$V_{th}$ memory cell, the controller 920 may perform a third programming operation that includes writing third data 925 to memory cell set 935. Third data 925 may be an inverted version of input data 905. Accordingly, after the third programming operation is performed, the first group of memory cells (the Group-0 memory cells) may be programmed to store the logic value 1 and the second group of memory cells (the Group-1 memory cells) may be programmed to store the logic value 0. Thus, memory cell set 935 may store data that is an inverted version of input data 905 after the third programming operation is performed.

In some examples, as part of the third programming operation, the memory cell that stores the flip bit 930 bit may be programmed to store a value that indicates that the other memory cells in memory cell set 935 are storing inverted data. In some examples, the memory cell that stores the flip bit 930 is programmed to store a logic value 0 during the third programming operation, where the logic value 0 may be used to indicate the stored data is inverted. In other examples, the memory cell that stores the flip bit 930 is programmed to store a logic value 1 during the third programming operation, where the logic value 1 may be used to indicate the stored data is inverted.

When data is retrieved from memory cell set 935, the controller may read the memory cell that stores the flip bit 930 to determine whether the retrieved data is inverted. If flip bit 930 indicates that the retrieve data is inverted, the controller may invert the retrieved data to obtain input data 905. In some examples, after inverting the retrieved data, one or more errors remain in the inverted data (e.g., errors caused by storage failures that are unrelated to high-$V_{th}$ memory cells). In such cases, the controller may perform an error correction procedure to detect and/or correct the remaining errors before outputting a data set that matches the originally received input data 905.

In another example, if memory cell set 935 does not include any defective memory cells, or if an occurrence of high-$V_{th}$ memory cells is limited to the first group of memory cells, controller 920 may refrain from performing a third programming operation that writes the logic value 0 to the first group of memory cells (the Group-0 memory cells) and preserves the logic value 1 stored at the second group of memory cells (the Group-1 memory cells). In such examples, the data stored at memory cell set after the second programming operation may be consistent with input data 905.

Figure 10:
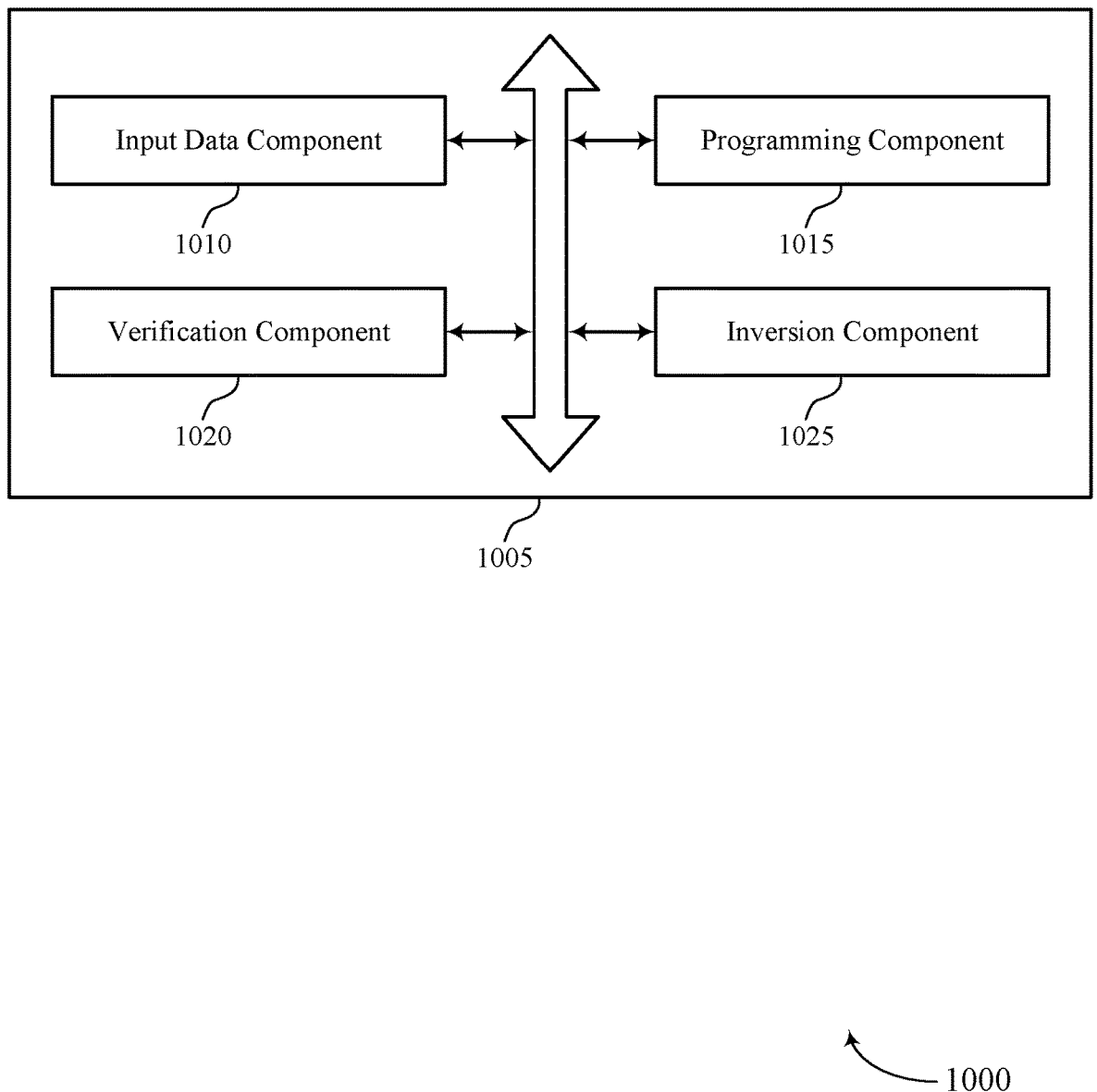
FIG. 10 shows a block diagram of a controller that supports techniques for programming self-selecting memory in accordance with examples as disclosed herein.

FIG. 10 shows a block diagram 1000 of a controller 1005 that supports techniques for programming self-selecting memory in accordance with examples as disclosed herein. The controller 1005 may be an example of aspects of a controller as described with reference to FIGS. 1, 2, 6, and 9. The controller 1005 may include an input data component 1010, a programming component 1015, a verification component 1020, and an inversion component 1025. Each of these modules may communicate, directly or indirectly, with one another (e.g., via one or more buses).

The input data component 1010 may receive data including a first set of bits and a second set of bits, where each bit of the first set of bits has a first logic value and corresponds to a first memory cell of a first set of memory cells and each bit of the second set of bits has a second logic value and corresponds to a second memory cell of a second set of memory cells.

In some examples, the input data component 1010 may store the first set of bits in a first register and the second set of bits in a second register based on receiving the data, where the determination of whether one or more of the second set of memory cells stores the first logic value is based on the first set of bits stored in the first register.

The programming component 1015 may perform a first programming operation for writing the second logic value to each memory cell of the first set of memory cells and the second set of memory cells.

In some examples, the programming component 1015 may perform a second programming operation for writing the first logic value to each memory cell of the first set of memory cells or to each memory cell of the second set of memory cells based on the determining.

In some examples, the programming component 1015 may select the second set of memory cells for the second programming operation based on determining that a memory cell of the second set of memory cells stores the first logic value after performing the first programming operation, where performing the second programming operation is based on selecting the second set of memory cells, and where the first set of memory cells and the second set of memory cells store second data that is an inverted version of the data after performing the second programming operation.

In some examples, the programming component 1015 may select the first set of memory cells for the second programming operation based on determining that each of the second set of memory cells stores the second logic value after performing the first programming operation, where performing the second programming operation is based on selecting the first set of memory cells, where the first set of memory cells and the second set of memory cells store the data after performing the second programming operation.

In some examples, the programming component 1015 may select the first set of memory cells based on determining that each of the second set of memory cells stores the second logic value after performing the first programming operation.

In some examples, the programming component 1015 may perform a third programming operation for writing the first logic value to the second set of memory cells and the second logic value to the first set of memory cells based on determining that a memory cell of the first set of memory cells stores the second logic value after performing the second programming operation, where the first set of memory cells and the second set of memory cells store second data that is an inverted version of the data after performing the third programming operation.

In some cases, the second logic value is opposite a logic value stored by memory cells having threshold voltages that exceeds an upper limit. In some cases, the first logic value and the logic value stored by memory cells having the threshold voltages that exceed the upper limit corresponds to a zero value and the second logic value corresponds to a one value. In some cases, the first set of memory cells includes a memory cell having a threshold voltage that exceeds the upper limit, and where a level of the positive voltage is below the threshold voltage.

In some examples, performing the first programming operation for writing the second logic value includes applying a positive voltage across the first set of memory cells and the second set of memory cells. In some examples, performing the second programming operation for writing the first logic value includes applying a negative voltage across each memory cell of the one of the first set of memory cells or the second set of memory cells.

In some cases, the second logic value is opposite a logic value stored by memory cells having threshold voltages that are below a lower limit. In some cases, the first logic value and the logic value stored by memory cells having the threshold voltages below the lower limit corresponds to a one value and the second logic value corresponds to a zero value.

In some examples, performing the first programming operation for writing the second logic value includes applying a negative voltage across the first set of memory cells and the second set of memory cells. In some examples, performing the second programming operation for writing the first logic value includes applying a positive voltage across each memory cell of the one of the first set of memory cells or the second set of memory cells.

The verification component 1020 may determine whether one or more of the second set of memory cells stores the first logic value after performing the first programming operation.

In some examples, the verification component 1020 may determine whether one or more of the first set of memory cells stores the second logic value after performing the second programming operation.

In some examples, the verification component 1020 may perform a verification operation that identifies a logic value stored by each of the second set of memory cells, where the determination of whether one or more of the second set of memory cells stores the first logic value is based on the verification operation.

The inversion component 1025 may program an indicator to indicate that the first set of memory cells and the second set of memory cells store the second data based on determining that the memory cell of the second set of memory cells stores the first logic value after performing the first programming operation.

In some examples, the inversion component 1025 may program an indicator to indicate that the first set of memory cells and the second set of memory cells store the data based on the determination that each of the second set of memory cells stores the second logic value after performing the first programming operation.

In some examples, the inversion component 1025 may program an indicator to indicate that the first set of memory cells and the second set of memory cells store the second data based on determining that a memory cell of the first set of memory cells stores the second logic value after performing the second programming operation.

Figure 11:
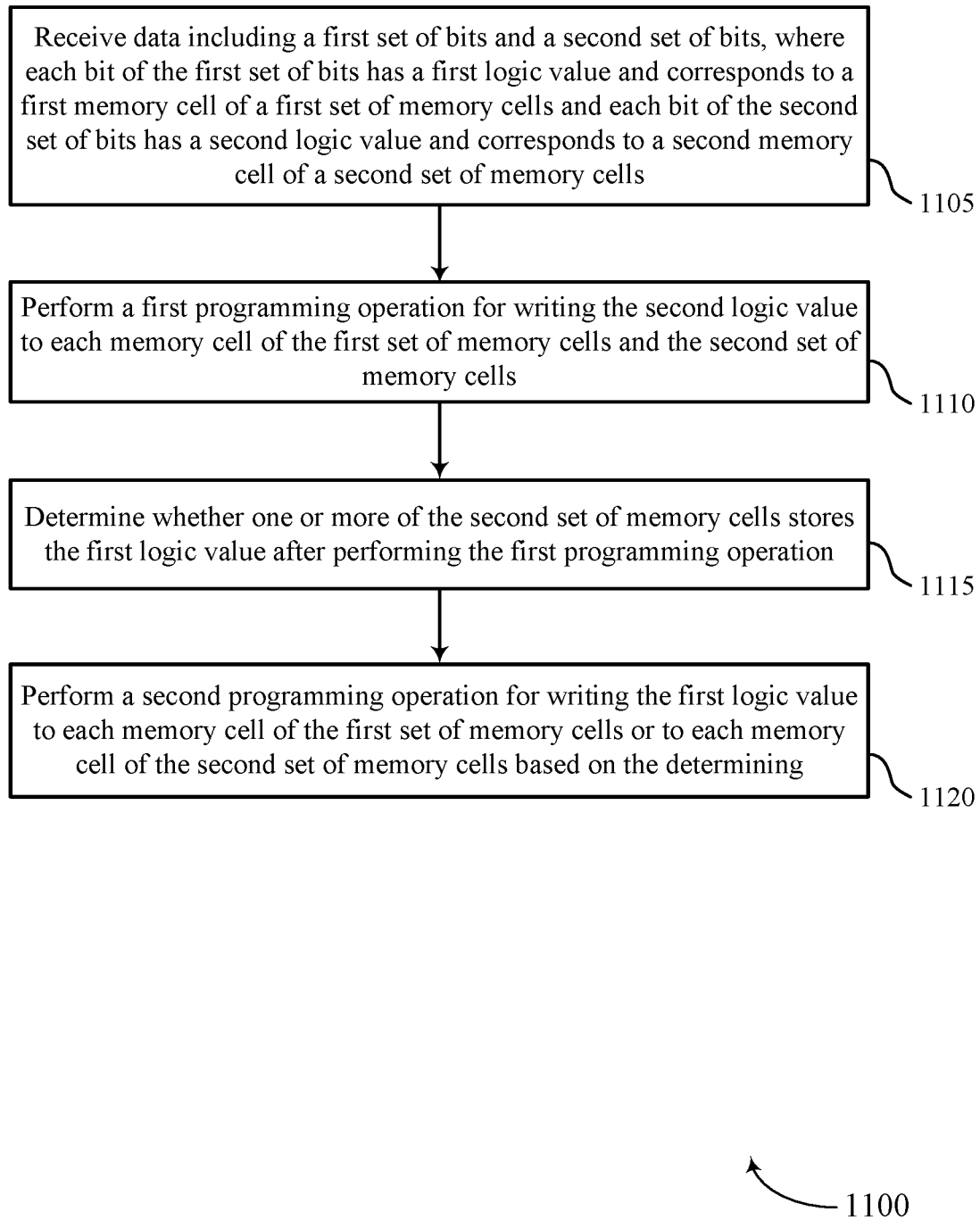
FIG. 11 shows a flowchart illustrating a method or methods that support techniques for programming self-selecting memory in accordance with examples as disclosed herein.

FIG. 11 shows a flowchart illustrating a method or methods 1100 that supports techniques for programming self-selecting memory in accordance with examples as disclosed herein. The operations of method 1100 may be implemented by a controller or its components as described herein. For example, the operations of method 1100 may be performed by a controller as described with reference to FIG. 10. In some examples, a controller may execute a set of instructions to control the functional elements of the controller to perform the described functions. Additionally, or alternatively, a controller may perform aspects of the described functions using special-purpose hardware.

At 1105, the controller may receive data including a first set of bits and a second set of bits, where each bit of the first set of bits has a first logic value and corresponds to a first memory cell of a first set of memory cells and each bit of the second set of bits has a second logic value and corresponds to a second memory cell of a second set of memory cells. The operations of 1105 may be performed according to the methods described herein. In some examples, aspects of the operations of 1105 may be performed by an input data component as described with reference to FIG. 10.

At 1110, the controller may perform a first programming operation for writing the second logic value to each memory cell of the first set of memory cells and the second set of memory cells. The operations of 1110 may be performed according to the methods described herein. In some examples, aspects of the operations of 1110 may be performed by a programming component as described with reference to FIG. 10.

At 1115, the controller may determine whether one or more of the second set of memory cells stores the first logic value after performing the first programming operation. The operations of 1115 may be performed according to the methods described herein. In some examples, aspects of the operations of 1115 may be performed by a verification component as described with reference to FIG. 10.

At 1120, the controller may perform a second programming operation for writing the first logic value to each memory cell of the first set of memory cells or to each memory cell of the second set of memory cells based on the determining. The operations of 1120 may be performed according to the methods described herein. In some examples, aspects of the operations of 1120 may be performed by a programming component as described with reference to FIG. 10.

In some examples, an apparatus as described herein may perform a method or methods, such as the method 1100. The apparatus may include features, means, or instructions (e.g., a non-transitory computer-readable medium storing instructions executable by a processor) for receiving data including a first set of bits and a second set of bits, where each bit of the first set of bits has a first logic value and corresponds to a first memory cell of a first set of memory cells and each bit of the second set of bits has a second logic value and corresponds to a second memory cell of a second set of memory cells, performing a first programming operation for writing the second logic value to each memory cell of the first set of memory cells and the second set of memory cells, determining whether one or more of the second set of memory cells stores the first logic value after performing the first programming operation, and performing a second programming operation for writing the first logic value to each memory cell of the first set of memory cells or to each memory cell of the second set of memory cells based on the determining.

Some examples of the method 1100 and the apparatus described herein may further include operations, features, means, or instructions for selecting the second set of memory cells for the second programming operation based on determining that a memory cell of the second set of memory cells stores the first logic value after performing the first programming operation, where performing the second programming operation may be based on selecting the second set of memory cells, and where the first set of memory cells and the second set of memory cells store second data that may be an inverted version of the data after performing the second programming operation.

Some examples of the method 1100 and the apparatus described herein may further include operations, features, means, or instructions for programming an indicator to indicate that the first set of memory cells and the second set of memory cells store the second data based on determining that the memory cell of the second set of memory cells stores the first logic value after performing the first programming operation.

Some examples of the method 1100 and the apparatus described herein may further include operations, features, means, or instructions for selecting the first set of memory cells for the second programming operation based on determining that each of the second set of memory cells stores the second logic value after performing the first programming operation, where performing the second programming operation may be based on selecting the first set of memory cells, where the first set of memory cells and the second set of memory cells store the data after performing the second programming operation.

Some examples of the method 1100 and the apparatus described herein may further include operations, features, means, or instructions for programming an indicator to indicate that the first set of memory cells and the second set of memory cells store the data based on the determination that each of the second set of memory cells stores the second logic value after performing the first programming operation.

Some examples of the method 1100 and the apparatus described herein may further include operations, features, means, or instructions for selecting the first set of memory cells based on determining that each of the second set of memory cells stores the second logic value after performing the first programming operation, and determining whether one or more of the first set of memory cells stores the second logic value after performing the second programming operation.

Some examples of the method 1100 and the apparatus described herein may further include operations, features, means, or instructions for performing a third programming operation for writing the first logic value to the second set of memory cells and the second logic value to the first set of memory cells based on determining that a memory cell of the first set of memory cells stores the second logic value after performing the second programming operation, where the first set of memory cells and the second set of memory cells store second data that may be an inverted version of the data after performing the third programming operation.

Some examples of the method 1100 and the apparatus described herein may further include operations, features, means, or instructions for programming an indicator to indicate that the first set of memory cells and the second set of memory cells store the second data based on determining that a memory cell of the first set of memory cells stores the second logic value after performing the second programming operation.

In some examples of the method 1100 and the apparatus described herein, the second logic value may be opposite a logic value stored by memory cells having threshold voltages that exceeds an upper limit, and performing the first programming operation for writing the second logic value may include operations, features, means, or instructions for applying a positive voltage across the first set of memory cells and the second set of memory cells, and performing the second programming operation for writing the first logic value may include operations, features, means, or instructions for applying a negative voltage across each memory cell of the one of the first set of memory cells or the second set of memory cells.

In some examples of the method 1100 and the apparatus described herein, the first logic value and the logic value stored by memory cells having the threshold voltages that exceed the upper limit corresponds to a zero value and the second logic value corresponds to a one value.

In some examples of the method 1100 and the apparatus described herein, the first set of memory cells includes a memory cell having a threshold voltage that exceeds the upper limit, and where a level of the positive voltage may be below the threshold voltage.

In some examples of the method 1100 and the apparatus described herein, the second logic value may be opposite a logic value stored by memory cells having threshold voltages that may be below a lower limit, and performing the first programming operation for writing the second logic value may include operations, features, means, or instructions for applying a negative voltage across the first set of memory cells and the second set of memory cells, and performing the second programming operation for writing the first logic value may include operations, features, means, or instructions for applying a positive voltage across each memory cell of the one of the first set of memory cells or the second set of memory cells.

In some examples of the method 1100 and the apparatus described herein, the first logic value and the logic value stored by memory cells having the threshold voltages below the lower limit corresponds to a one value and the second logic value corresponds to a zero value.

Some examples of the method 1100 and the apparatus described herein may further include operations, features, means, or instructions for storing the first set of bits in a first register and the second set of bits in a second register based on receiving the data, where the determination of whether one or more of the second set of memory cells stores the first logic value may be based on the first set of bits stored in the first register.

In some examples of the method 1100 and the apparatus described herein, performing the first programming operation may include operations, features, means, or instructions for performing a verification operation that identifies a logic value stored by each of the second set of memory cells, where the determination of whether one or more of the second set of memory cells stores the first logic value may be based on the verification operation.

It should be noted that the methods described herein are possible implementations, and that the operations and the steps may be rearranged or otherwise modified and that other implementations are possible. Furthermore, portions from two or more of the methods may be combined.

An apparatus is described. The apparatus may include a memory array including a first set of memory cells and a second set of memory cells, a controller coupled with the memory array and configured to, perform a first programming operation for writing the second logic value to each memory cell of the first set of memory cells and the second set of memory cells, determine whether one or more of the second set of memory cells stores the first logic value after performing the first programming operation, and perform a second programming operation for writing the first logic value to each memory cell of the first set of memory cells or to each memory cell of the second set of memory cells based on the determining.

Some examples may further include selecting the second set of memory cells for the second programming operation based on determining that a memory cell of the second set of memory cells stores the first logic value after performing the first programming operation, where performing the second programming operation may be based on selecting the second set of memory cells, where the first set of memory cells and the second set of memory cells store second data that may be an inverted version of the data after performing the second programming operation.

Some examples may further include program an indicator to indicate that the first set of memory cells and the second set of memory cells store the second data based on determining that the memory cell of the second set of memory cells stores the first logic value after performing the first programming operation.

Some examples may further include selecting the first set of memory cells for the second programming operation based on determining that each of the second set of memory cells stores the second logic value after performing the first programming operation, where performing the second programming operation may be based on selecting the first set of memory cells, where the first set of memory cells and the second set of memory cells store the data after performing the second programming operation.

Some examples may further include program an indicator to indicate that the first set of memory cells and the second set of memory cells store the data based on the determination that each of the second set of memory cells stores the second logic value after performing the first programming operation.

Some examples may further include selecting the first set of memory cells based on determining that each of the second set of memory cells stores the second logic value after performing the first programming operation, determine whether one or more of the first set of memory cells stores the second logic value after performing the second programming operation, and perform a third programming operation for writing the first logic value to the second set of memory cells and the second logic value to the first set of memory cells based on determining that a memory cell of the first set of memory cells stores the second logic value after performing the second programming operation, where the first set of memory cells and the second set of memory cells store second data that may be an inverted version of the data after performing the third programming operation.

Information and signals described herein may be represented using any of a variety of different technologies and techniques. For example, data, instructions, commands, information, signals, bits, symbols, and chips that may be referenced throughout the description may be represented by voltages, currents, electromagnetic waves, magnetic fields or particles, optical fields or particles, or any combination thereof. Some drawings may illustrate signals as a single signal; however, the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" refers to condition of moving from an open-circuit relationship between components in which signals are not presently capable of being communicated between the components over a conductive path to a closed-circuit relationship between components in which signals are capable of being communicated between components over the conductive path. When a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components, the controller affects a change that prevents signals from flowing between the components using a conductive path that previously permitted signals to flow.

As used herein, the term "electrode" may refer to an electrical conductor, and in some examples, may be employed as an electrical contact to a memory cell or other component of a memory array. An electrode may include a trace, wire, conductive line, conductive layer, or the like that provides a conductive path between elements or components of a memory array.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In other examples, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

Information and signals described herein may be represented using any of a variety of different technologies and techniques. For example, data, instructions, commands, information, signals, bits, symbols, and chips that may be referenced throughout the description may be represented by voltages, currents, electromagnetic waves, magnetic fields or particles, optical fields or particles, or any combination thereof.

The various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described herein can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read-only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of these are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. A method, comprising:
    receiving a set of data; and
    writing the set of data to a set of memory cells comprising a first subset of memory cells and a second subset of memory cells, wherein writing the set of data to the set of memory cells comprises:
        performing a first operation for writing a first logic value to each memory cell of the set of memory cells; and
        performing a second operation for writing a second logic value to each memory cell of the first subset of memory cells based at least in part on a memory cell of the first subset of memory cells storing the second logic value after the first operation for writing the first logic value to each memory cell of the set of memory cells is performed.

2. The method of claim 1, wherein the set of data comprises a first set of bits and a second set of bits, each bit of the first set of bits having the first logic value and corresponding to a respective memory cell of the first subset of memory cells and each bit of the second set of bits having the second logic value and corresponding to a respective memory cell of the second subset of memory cells.

3. The method of claim 1, further comprising:
    storing an inverted version of the set of data in the set of memory cells after the second operation for writing the second logic value to each memory cell of the first subset of memory cells is performed.

4. The method of claim 1, further comprising:
    programming an indicator to indicate that the set of memory cells store an inverted version of the set of data based at least in part on the memory cell of the first subset of memory cells storing the second logic value after the first operation for writing the first logic value is performed.

5. The method of claim 1, further comprising:
    determining that the memory cell of the first subset of memory cells is defective based at least in part on the memory cell of the first subset of memory cells storing the second logic value after the first operation for writing the first logic value is performed.

6. The method of claim 5, wherein:
the first logic value is associated with a first programming voltage and the second logic value is associated with a second programming voltage that is less than the first programming voltage, and
determining that the memory cell is defective comprises determining that the memory cell has a high threshold voltage defect based at least in part on the first logic value having the first programming voltage.

7. The method of claim 5, wherein:
the first logic value is associated with a first programming voltage and the second logic value is associated with a second programming voltage that is greater than the first programming voltage, and
determining that the memory cell is defective comprises determining that the memory cell has a low threshold voltage defect based at least in part on the first logic value having the first programming voltage.

8. The method of claim 5, wherein the first logic value is a 1 and the second logic value is a 0.

9. The method of claim 5, wherein the first logic value is a 0 and the second logic value is a 1.

10. A method, comprising:
receiving a set of data; and
writing the set of data to a set of memory cells comprising a first subset of memory cells and a second subset of memory cells, wherein writing the set of data to the set of memory cells comprises:
performing a first operation for writing a first logic value to each memory cell of the set of memory cells; and
performing a second operation for writing a second logic value to each memory cell of the second subset of memory cells based at least in part on each memory cell of the first subset of memory cells storing the first logic value after the first operation for writing the first logic value to each memory cell is performed.

11. The method of claim 10, wherein the set of data comprises a first set of bits and a second set of bits, each bit of the first set of bits having the first logic value and corresponding to a respective memory cell of the first subset of memory cells and each bit of the second set of bits having the second logic value and corresponding to a respective memory cell of the second subset of memory cells.

12. The method of claim 10, further comprising:
storing the set of data in the set of memory cells after the second operation for writing the second logic value to each memory cell of the second subset of memory cells is performed.

13. The method of claim 10, wherein writing the set of data to the set of memory cells further comprises:
performing a third operation for writing the second logic value to each memory cell of the first subset of memory cells and the first logic value to each memory cell of the second subset of memory cells based at least in part on a memory cell of the second subset of memory cells storing the first logic value after the second operation for writing the first logic value to each memory cell of the second subset of memory cells is performed.

14. The method of claim 13, further comprising:
storing an inverted version of the set of data in the set of memory cells after the second logic value is written to each memory cell of the first subset of memory cells and the first logic value is written to each memory cell of the second subset of memory cells.

15. The method of claim 10, further comprising:
programming an indicator to indicate that the set of memory cells store an inverted version of the set of data based at least in part on a memory cell of the second subset of memory cells storing the first logic value after the second operation for writing the second logic value is performed.

16. An apparatus, comprising:
memory, and
a controller coupled with the memory and configured to cause the apparatus to:
receive a set of data; and
write the set of data to a set of memory cells comprising a first subset of memory cells and a second subset of memory cells, wherein, to write the set of data to the set of memory cells, the controller is further configured to cause the apparatus to:
perform a first operation for writing a first logic value to each memory cell of the set of memory cells; and
perform a second operation for writing a second logic value to each memory cell of the first subset of memory cells based at least in part on a memory cell of the first subset of memory cells storing the second logic value after the first operation for writing the first logic value to each memory cell is performed.

17. The apparatus of claim 16, wherein the set of data comprises a first set of bits and a second set of bits, each bit of the first set of bits having the first logic value and corresponding to a respective memory cell of the first subset of memory cells and each bit of the second set of bits having the second logic value and corresponding to a respective memory cell of the second subset of memory cells.

18. The apparatus of claim 16, wherein the controller is further configured to cause the apparatus to:
store an inverted version of the set of data in the set of memory cells after the second operation for writing the second logic value to each memory cell of the first subset of memory cells is performed.

19. The apparatus of claim 16, wherein the controller is further configured to cause the apparatus to:
program an indicator to indicate that the set of memory cells store an inverted version of the set of data based at least in part on the memory cell of the first subset of memory cells storing the second logic value after the first operation for writing the first logic value is performed.

20. The apparatus of claim 16, wherein the controller is further configured to cause the apparatus to:
determine that the memory cell of the first subset of memory cells is defective based at least in part on the memory cell of the first subset of memory cells storing the second logic value after the first operation for writing the first logic value is performed.

* * * * *